(12) United States Patent
Rantala et al.

(10) Patent No.: US 10,290,558 B2
(45) Date of Patent: May 14, 2019

(54) TRANSPARENT SILOXANE ENCAPSULANT AND ADHESIVE

(71) Applicant: Inkron Oy, Espoo (FI)

(72) Inventors: Juha Rantala, Espoo (FI); Jarkko Heikkinen, Espoo (FI); Janne Kylmä, Espoo (FI)

(73) Assignee: Inkron Oy, Espoo (FI)

( * ) Notice: Subject to any disclaimer, the term of this patent is extended or adjusted under 35 U.S.C. 154(b) by 0 days.

(21) Appl. No.: 15/319,820

(22) PCT Filed: Jun. 22, 2015

(86) PCT No.: PCT/FI2015/050453
§ 371 (c)(1),
(2) Date: Dec. 19, 2016

(87) PCT Pub. No.: WO2015/193554
PCT Pub. Date: Dec. 23, 2015

(65) Prior Publication Data
US 2017/0152419 A1    Jun. 1, 2017

Related U.S. Application Data

(60) Provisional application No. 62/014,153, filed on Jun. 19, 2014.

(30) Foreign Application Priority Data

Jun. 19, 2014  (FI) ...................................... 20145607

(51) Int. Cl.
| | |
|---|---|
| H01L 23/29 | (2006.01) |
| C08K 5/00 | (2006.01) |
| C08K 5/07 | (2006.01) |
| C08L 83/06 | (2006.01) |
| C03C 17/30 | (2006.01) |
| C09J 183/04 | (2006.01) |
| G02F 1/1333 | (2006.01) |
| G02F 1/1335 | (2006.01) |
| G06F 3/044 | (2006.01) |
| H01L 27/32 | (2006.01) |
| H01L 33/50 | (2010.01) |
| H01L 33/56 | (2010.01) |
| H01L 51/00 | (2006.01) |
| H01L 51/52 | (2006.01) |
| C08G 77/14 | (2006.01) |
| C08G 77/20 | (2006.01) |
| C08G 77/00 | (2006.01) |
| C08K 3/22 | (2006.01) |

(52) U.S. Cl.
CPC ............ *H01L 23/296* (2013.01); *C03C 17/30* (2013.01); *C08K 5/0025* (2013.01); *C08K 5/07* (2013.01); *C08L 83/06* (2013.01); *C09J 183/04* (2013.01); *G02F 1/13338* (2013.01); *G02F 1/133514* (2013.01); *G06F 3/044* (2013.01); *H01L 27/323* (2013.01); *H01L 33/502* (2013.01); *H01L 33/56* (2013.01); *H01L 51/0097* (2013.01); *H01L 51/5237* (2013.01); *C03C 2218/11* (2013.01); *C08G 77/14* (2013.01); *C08G 77/20* (2013.01); *C08G 77/80* (2013.01); *C08K 2003/2244* (2013.01); *G06F 2203/04102* (2013.01); *G06F 2203/04103* (2013.01); *H01L 2224/48091* (2013.01); *H01L 2224/73265* (2013.01); *H01L 2251/5338* (2013.01)

(58) Field of Classification Search
CPC ............... C08K 2003/2203–2003/2296; C08K 2003/28; C08K 2003/282; B05D 3/061; B05D 3/067
See application file for complete search history.

(56) References Cited

U.S. PATENT DOCUMENTS

| | | | |
|---|---|---|---|
| 5,300,608 | A | 4/1994 | Chu et al. |
| 6,984,483 | B1 | 1/2006 | Roscher et al. |
| 2003/0216537 | A1 | 11/2003 | Friedrich |
| 2009/0029287 | A1 | 1/2009 | Kobayashi et al. |
| 2010/0123259 | A1 | 5/2010 | Yorisue |
| 2013/0165615 | A1 | 6/2013 | Schamschurin et al. |
| 2014/0051821 | A1 | 2/2014 | Popall et al. |
| 2017/0369654 | A1* | 12/2017 | Kao ...................... C03C 17/001 |

FOREIGN PATENT DOCUMENTS

| | | |
|---|---|---|
| JP | 2006299251 A | 11/2006 |
| JP | 2010286774 A | 12/2010 |
| WO | WO 2012/097836 | * 7/2012 |

OTHER PUBLICATIONS

Cai D.K. et al, Optical absorption in transparent PDMS materials applied for multimode waveguides fabrication, Optical Materials, vol. 30, 2008.

* cited by examiner

*Primary Examiner* — Marc S Zimmer
(74) *Attorney, Agent, or Firm* — Seppo Laine Oy

(57) ABSTRACT

An adhesive or encapsulant composition, having a siloxane polymer having a molecular weight of from 300 to 150,000 g/mol and having a viscosity of from 1000 to 100,000 mPa-sec at 5 rpm viscometer and at 25° C., and a curing agent that aids in curing the siloxane polymer upon the application of ultraviolet light. The composition is transmissive to visible light with an optical transmissivity of 95% or more in the visible spectrum at a thickness of 1 mm or less, and wherein the siloxane polymer is a material formed without hydrosilylation and has less than 5 mol % of Si—OH groups compared to all groups bound to Si therein, and substantially no Si—H bonds.

25 Claims, 13 Drawing Sheets

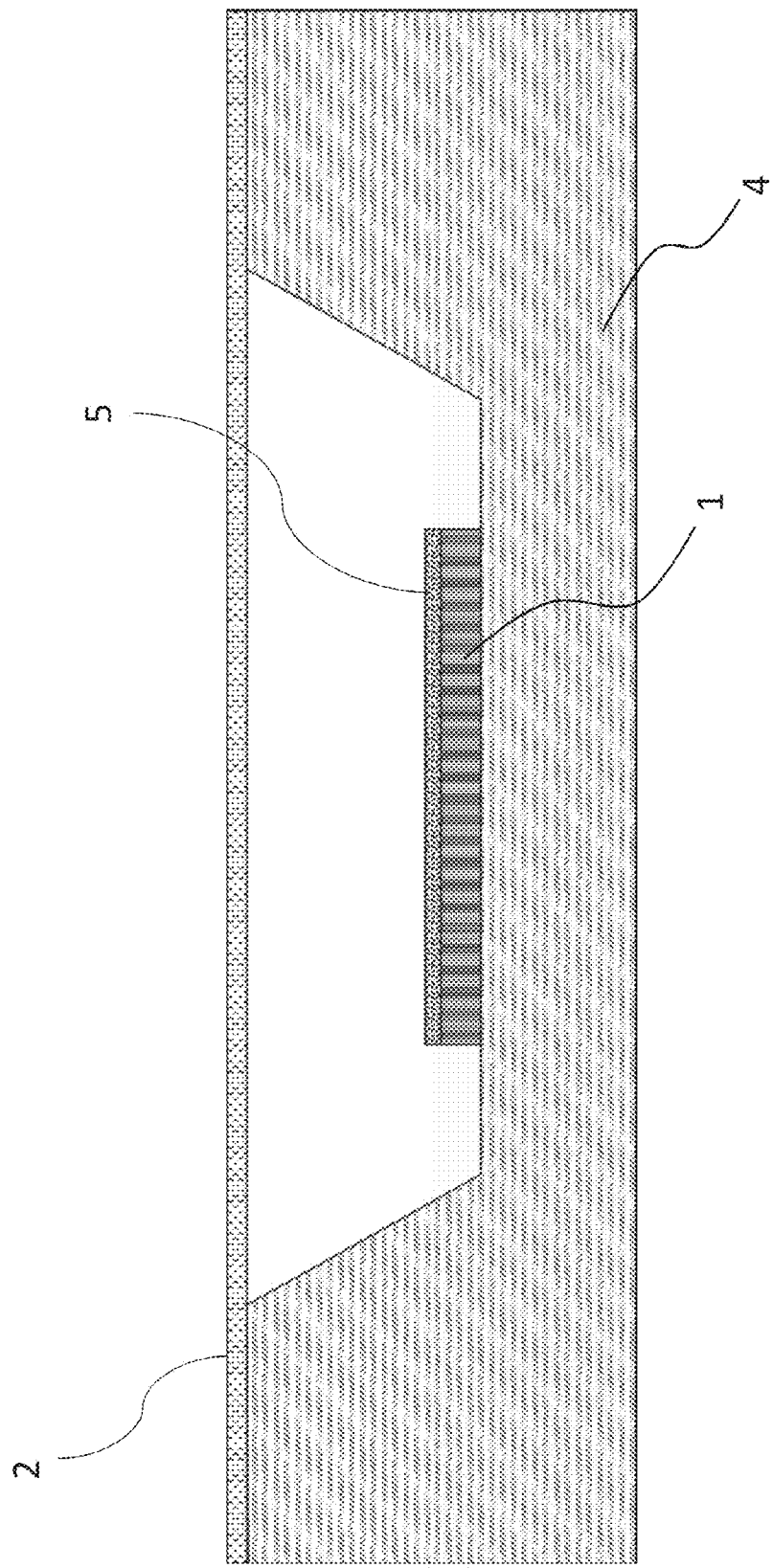

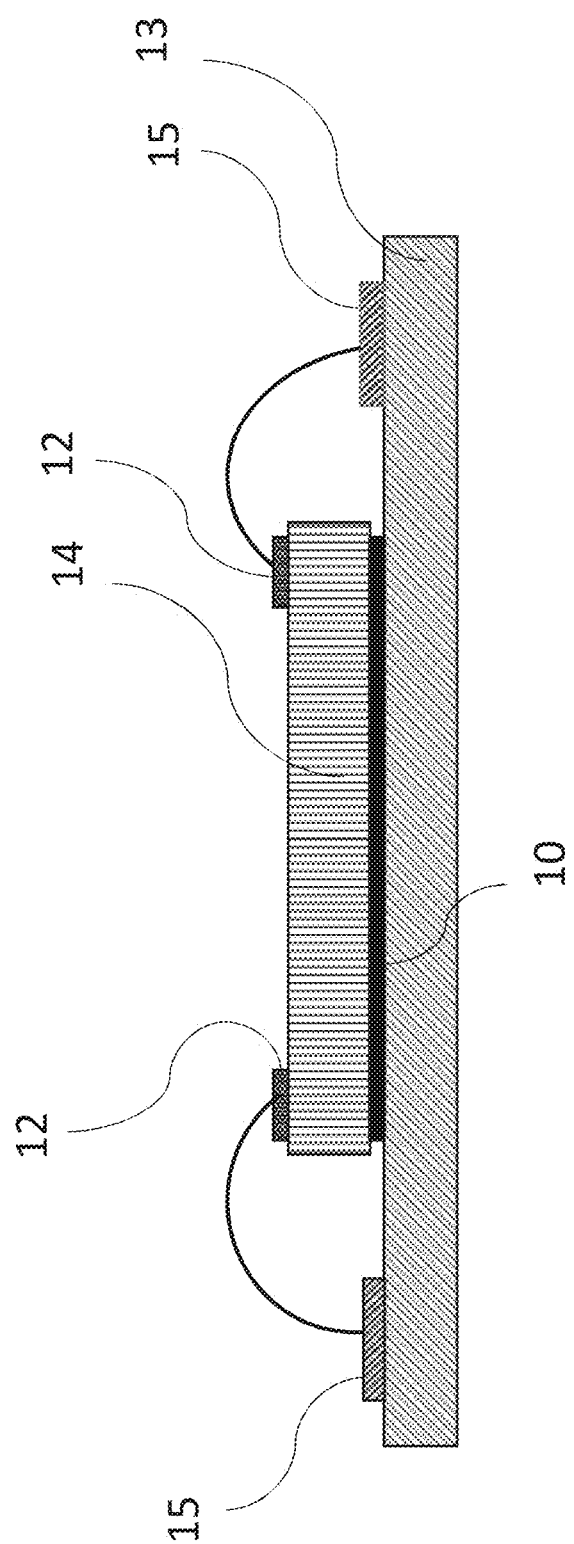

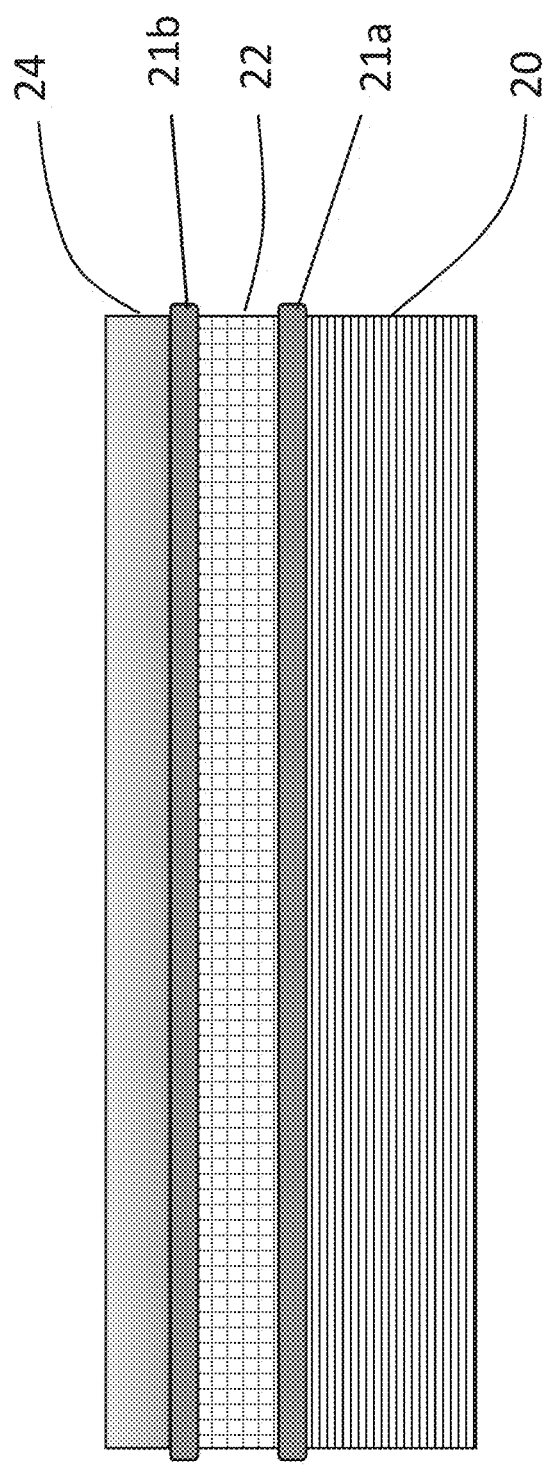

TRANSPARENT SILOXANE ENCAPSULANT AND ADHESIVE

TECHNICAL FIELD

The present invention relates to encapsulants and adhesives. In particular, the present invention concerns a composition for an adhesive or encapsulant, comprising a siloxane polymer and a curing agent that is capable of aiding in curing of the siloxane polymer. The present invention also concerns a cured siloxane polymer film which is transmissive to visible light, and a method of making such a film.

BACKGROUND ART

Light emitting diode (LED) lighting systems are becoming more widely used instead of traditional lighting. Light emitting diode lamps (an example of solid state lighting) can have advantages over traditional lighting such as the incandescent light bulb, halogen lighting, or fluorescent lighting, due to lower energy usage, increased stability and longer lifetimes, ability to be used in a wider variety of applications than fluorescent lighting, ability to be tuned to an exact color desired, among other reasons. In some embodiments, a single LED chip/die is within the lamp, and in other embodiments a plurality of LEDs is within the same lamp. The outer housing of an LED lamp can be made to the same specifications as an incandescent bulb, thus allowing use where incandescent bulbs are used.

Light emitting diodes (LEDs) are solid state devices that convert electric energy to light, and generally have at least one semiconductor material with n-doped and p-doped portions. Organic light emitting diodes are also known. When a bias is applied across semiconductor material, holes and electrons are injected into the active layer where they recombine to generate light. Light is emitted from the active layer and can be directed in primarily one direction, or in any direction, depending upon the type of LED.

LEDs can provide white light with a single LED, such as with a blue or violet LED that has a phosphor to shift the light closer to a perceived white light. LEDs may provide a single color (red, green or blue for example), or may be provided as different color LEDs in the same lamp which combine to provide white light. Examples of LEDs may include red LEDs using GaAsP and green LEDs using GaP, as well as nitride semiconductor LEDs that form green, blue or ultraviolet light. As LEDs become increasingly brighter, heat dissipation becomes an increasing concern, as heat build-up can degrade the LED performance.

Due to the desire for LED lamps to have high brightness and efficiency, passivation layers, adhesives and encapsulants preferably should be highly transparent to visible light.

Polymeric materials, including siloxane materials, are disclosed in US 2004010676, U.S. Pat. No. 6,984,483, US 20130165615 and U.S. Pat. No. 5,300,608.

There is still need for siloxane materials that can provide improved properties, such as at least one of transparency, low haze, low yellowing over time and low shrinkage, high durability and good thermal stability.

SUMMARY OF INVENTION

It is an aim of the present invention to remove at least a part of the problems relating to the art.

In a first aspect of the present invention, adhesive or encapsulant compositions are provided.

Such compositions are formed by siloxane polymers having a molecular weight of from 300 to 150,000 g/mol and having a viscosity of from 1000 to 100,000 mPa-sec at 5 rpm viscometer and at 25° C., and a curing agent that aids in curing the siloxane polymer upon the application of ultraviolet light. The composition is transmissive to visible light with an optical transmissivity of 95% or more in the visible spectrum at a thickness of 1 mm or less, and wherein the siloxane polymer is a material formed without hydrosilylation and has less than 5 mol % of Si—OH groups compared to all groups bound to Si therein, and substantially no Si—H bonds.

Also disclosed herein is a siloxane polymer film formed on a substrate having a UV-cured siloxane polymer film held on a substrate, which film is transmissive to visible light with an optical transmissivity of 95% or more in the visible, and wherein the siloxane polymer has less than 5 mol % of Si—OH groups compared to all groups bound to Si therein, and substantially no Si—H bonds.

Additionally disclosed is a method for making a siloxane particle film, including depositing on a substrate a siloxane composition that comprises a siloxane polymer formed without hydrosilylation, and having substantially no Si—OH groups therein, and having substantially no Si—H groups therein, and wherein the siloxane composition comprises a curing agent that aids in curing the siloxane polymer upon the application of ultraviolet light. The siloxane composition has a molecular weight of from 300 to 150,000 g/mol and a viscosity of from 1000 to 100,000 mPa-sec at 5 rpm viscometer and at 25° C. Ultraviolet light is directed at the deposited siloxane composition so as to cure the composition and form a hardened film, wherein the hardened film is transmissive to visible light with an optical transmissivity of 95% or more in the visible spectrum.

More specifically, the present invention is characterized by what is stated in the characterizing parts of the independent claims.

Example embodiments will be more clearly understood from the following detailed description taken in conjunction with the accompanying drawings, in which:

BRIEF DESCRIPTION OF THE DRAWINGS

FIGS. 1a to 1d illustrate examples of encapsulation of LED devices;

FIG. 2 illustrates an adhesive for die attaching a die to a support substrate;

FIG. 3 illustrates a touchscreen display with adhesives bonding different portions thereof;

DETAILED DESCRIPTION OF EMBODIMENTS

Figure 1A:
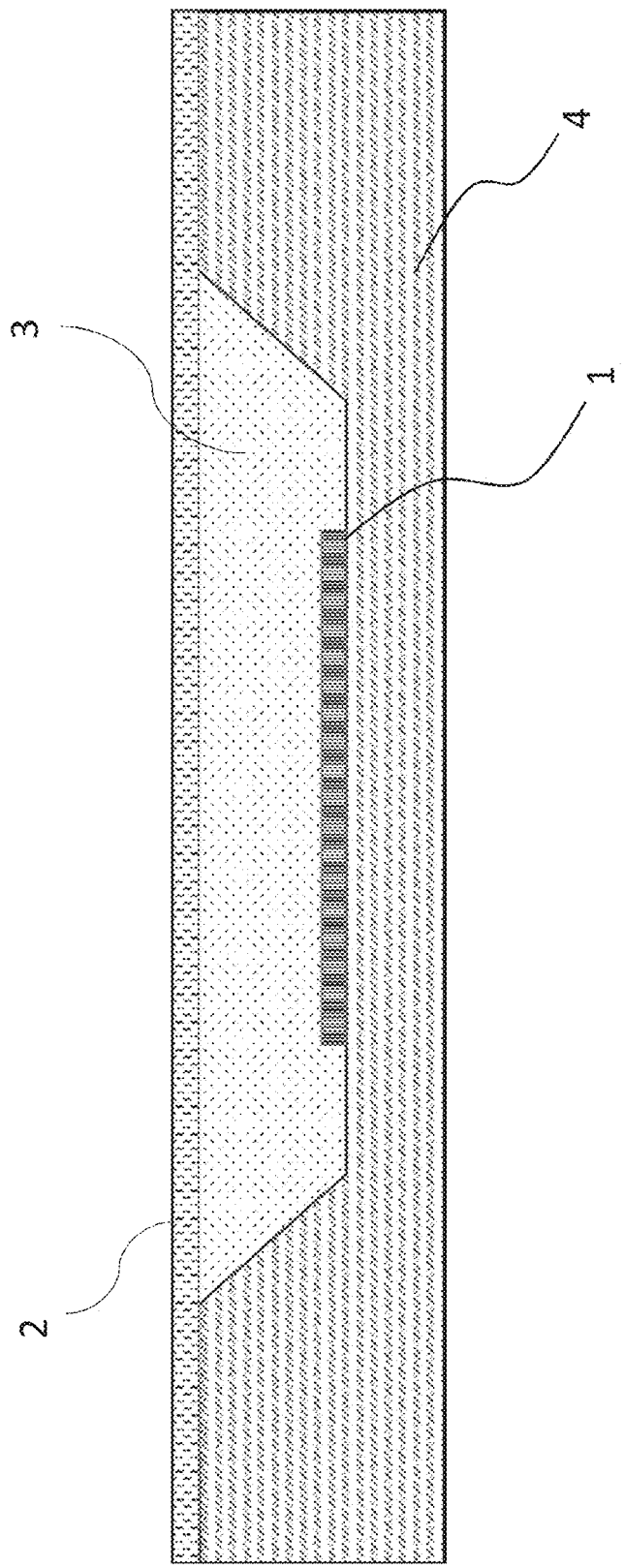

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will also be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It is noted that, as used herein, the singular forms of "a", "an" and "the" include plural referents unless the context clearly dictates otherwise. It will be further understood that the term "comprises" and/or "comprising", when used in this specification, specify the presence of stated features, steps, operations, elements, and/or components, but do not preclude the addition of one or more other features, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The lower case letters used in the below formulas for monomers and polymers stand in particular for integers.

The siloxane materials as disclosed herein can be used in any desired LED device, however by way of a first example a GaN LED can be used. GaN-based LEDs are a particular type of luminescent device known as solid state light source, which have many advantages such as compactness, low energy-consumption, long life time, are mercury free, have a high efficiency, and low ratio of service. GaN LEDs are provided in different forms and combinations in lighting applications, such as a) a combination of three kinds of monochromatic LEDs (blue, green, red); b) combination of blue light LED with yellow fluorescent powder; c) a combination of ultraviolet LED with trichromatic red-green-blue fluorescent powder, among other combinations and implementations.

White light can be obtained based on complementary color theory through the combination of YAG:Ce fluorescent material of Yttrium-Aluminium-Garnet structure using a blue light LED. Since the light emitted from YAG is yellow-green, the obtained white light is characterized to have high color temperature and cool tone so that the coloration indexing is not satisfactory for all uses. As a result, green, yellow or red fluorescent powder can be added to achieve white light with different color temperatures (from cool tones to warm tones) and improve the coloration indexing. Other phosphor hosts, particularly those based on the silicates, sulphates, nitridosilicates, and oxo-nitridosilicates, can be used to improve color rendering.

More particularly, a white LED may use a 450-470 nm blue Gallium Nitride (GaN) LED covered by a yellowish phosphor/scintillator coating, which can be made of YAG:Ce yttrium aluminum garnet crystals coped with cerium. As yellow light stimulates the red and green cones of the human eye, the resulting mix of blue light emitted from the GaN LED, and the yellow light emitted from the phosphors, appears as white light. Other combinations of LEDs and phosphors can produce the appearance of white light as well. Combinations of LEDs can give the appearance of white light, such as homoepitaxially grown ZnSe on a ZnSe substrate which simultaneously emits blue light from its active region and yellow from the substrate. Also a combination of red, green and blue LEDs is known for producing white light, with or without phosphors. Also possible are tungstate, carbidonitride, molybdate and selenide phosphors, as well as quantum dots.

The combination of YAG phosphor and blue LED is a common combination for situations where high color rendering index (CRI) and warm color temperature are not needed. Alternatively silicate phosphors are possible, e.g. that emit green, yellow and orange colors (such as from 507 nm to 600 nm) from UV violet and blue light sources. For LED applications that require warm colors and saturated reds (e.g. for display or residential/retail lighting), red and/or green phosphors can be desirable. Nitride phosphors (or oxynitride phosphors) are possibilities. Red nitride phosphors can emit color such as between 620 and 670 nm. Also possible are aluminate phosphors that e.g. emit light in the green or yellow spectrum, such as from 516 to 560 nm.

Due to the desire for LED lamps to have high brightness and efficiency, passivation layers, adhesives and encapsulants preferably should be highly transparent to visible light. A siloxane material, as will be disclosed below, with or without particles within, can provide such transparency, as well as other properties such as low haze, low yellowing over time, low shrinkage, high durability, good thermal stability, low application temperatures, and/or good thermal conductivity, to name a few.

Figure 1B:
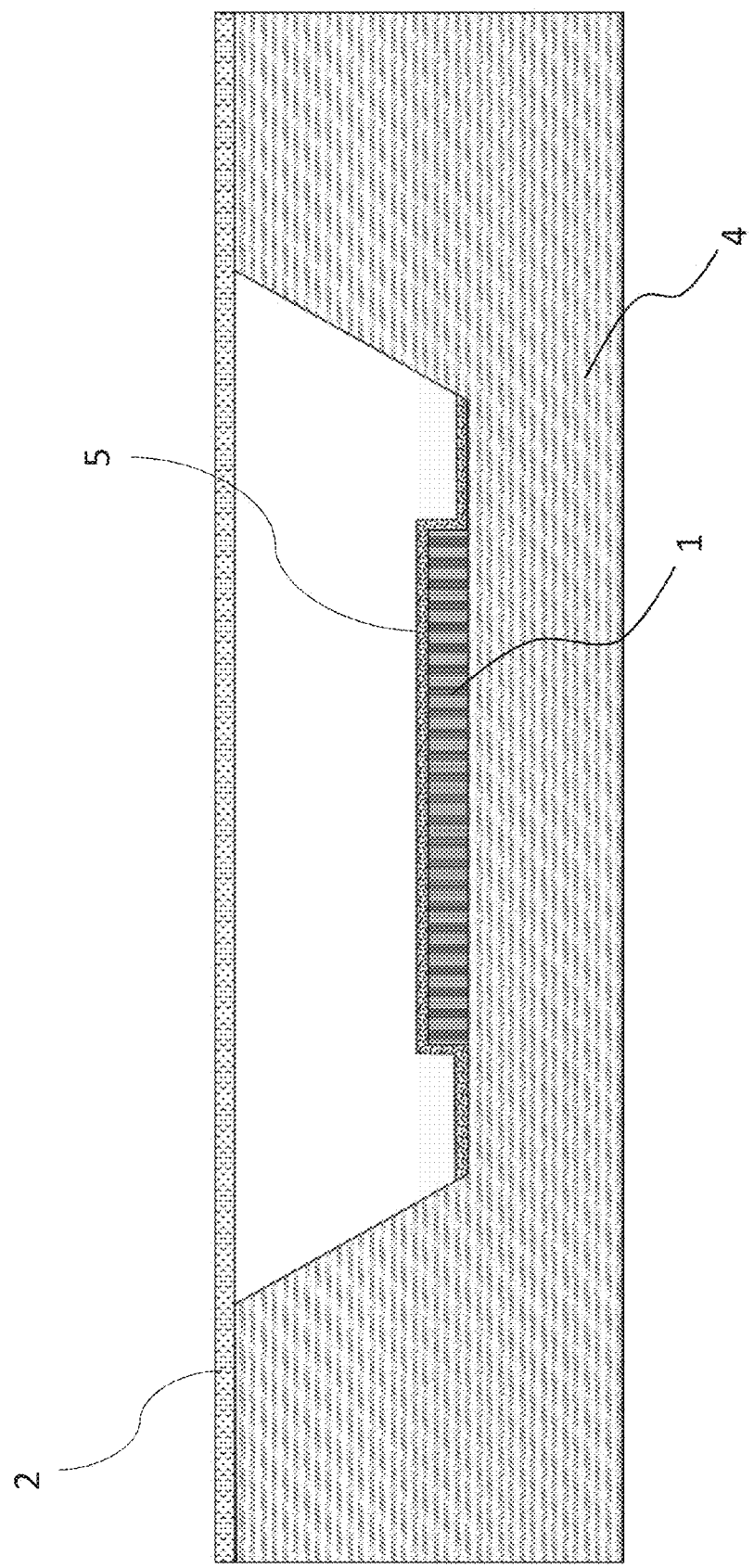
Figure 1D:
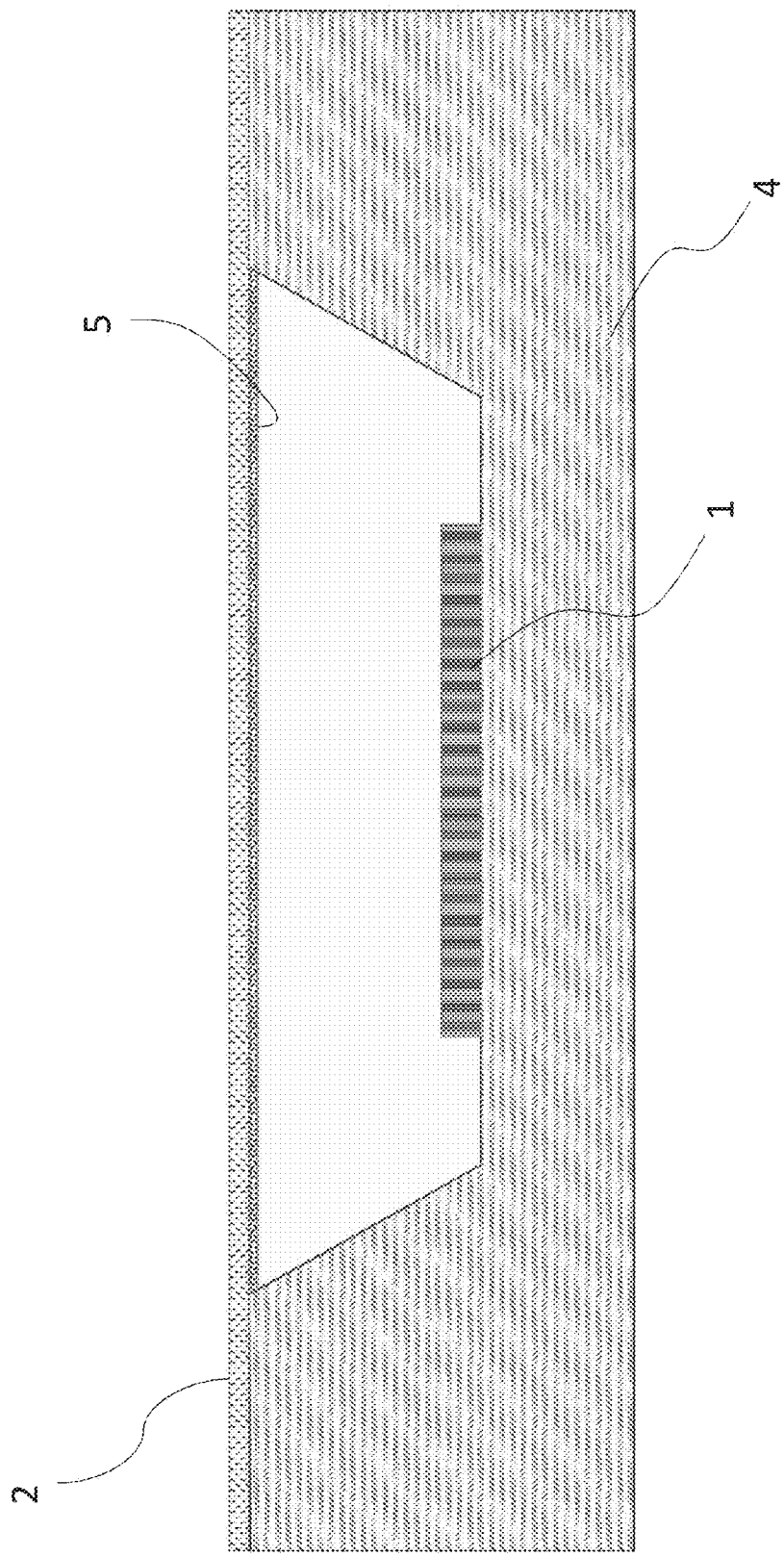

There are many alternatives for the LED lamps with the siloxane materials as disclosed herein. For example, in FIG. 1a, a die 1 can be bonded to package substrate 4 and being covered with a cover substrate 2 and filled with a siloxane encapsulant 3 that may or may not have particles therein or phosphors or other wavelength shifting elements therein, depending upon the desired use of the lamp. Or, as can be seen in FIG. 1b, a conformal layer 5 can be applied, which is the siloxane material (with or without added particles as desired, and with or without phosphors as desired). The area between coating 5 and cover 2 can also be filled with siloxane encapsulant, again with or without particles added. Or, as can be seen in FIG. 1c, only die 1 is covered with the siloxane material with optional particles and phosphors. In this embodiment, typically the siloxane material is added at the wafer level prior to die singulation. Or as can be seen in FIG. 1d, a remote phosphor layer 5 can be provided, such as a layer formed on cover 2 (or this could alternatively be phosphors embedded within cover 2. As with the other examples, the siloxane may or may not have particles, though in these examples where light from the LED passes therethrough, preferably the encapsulant is optically transmissive. In FIGS. 10a-10d, the die in each case is of the substrate materials mentioned for previous examples, and can be attached if desired to the package substrate via the siloxane material as disclosed herein.

The siloxane material according to the disclosure herein, if used as an LED die attach adhesive, is preferably though not necessarily thermally conductive (e.g. can have a thermal conductivity such as greater than 0.1 W/(m·K) (e.g. from 0.1 W/(m·K) to 0.5 W/(m·K)), or greater than 0.2 W/(m·K), or greater than 0.5 watts per meter kelvin (W/(m·K)), preferably greater than 4.0 W/(m·K) and more preferably greater than 10.0 W/(m·K). Much higher thermal conductivity, such as greater than 25.0 W/(m·K)k or greater than 50.0 W/(m·K) are also possible depending upon the materials and concentrations selected.

The encapsulant is preferably optically transmissive in the visible spectrum. The encapsulant may be transmissive to visible light capable of transmitting at least 80% of visible light incident thereon, preferably at least 85% is transmitted, more preferably 90%. It is also possible that 92.5% of the visible light is transmitted, or even 95% or more.

As illustrated in FIG. 2, a die 14 is bonded to a supporting substrate, e.g. a package substrate 13.

Electrical connections between the two substrates is via bond wires between bond pads 12 on die 14 and pads 15 on substrate 13. Though die 14 can be a semiconductor substrate for an electronic device, in one example die 14 is an LED device and adhesive 10 and die 14 are optically transmissive to light, e.g. to light emitted by the LED such as in the visible or ultraviolet spectrum. In one example, die 14 is a sapphire substrate with a GaN light emitting diode formed thereon. As in the example of FIG. 1, the siloxane material used for adhesive 10 is preferably highly transmissive to visible light and thermally stable.

As illustrated in FIG. 3, a touch screen capacitive display device is illustrated in a simplified cross sectional view. As shown in FIG. 3, an LCD substrate 20 (having an array of liquid crystal elements, TFTs, color filters, etc) is provided. A touch sensitive substrate 22 is also provided, having formed thereon first and second patterned conductive layers with a dielectric material therebetween for providing a capacitive types touch sensitive panel. Finally a cover glass 24, which can be any suitable cover, preferably a durable and resistant cover such as gorilla glass, or otherwise a transparent acrylic or polyester or other polymeric cover. As can be seen in FIG. 3, the touch screen portion of the device is bonded to both the LCD portion of the device and the cover glass via adhesive layers 21a and 21b (as in an on-cell type touchscreen device), which are preferably the siloxane material as disclosed herein. Touch panel portion can be bonded via the siloxane adhesive to only the cover glass or the LCD portion as well. It is also possible that the touch panel portion is embedded within the LCD panel 20, such that only adhesive 21b is used to bond a cover glass thereon (as an in-cell type touchscreen device). Or, the touch panel portion 22 can be formed as part of the cover glass such that only adhesive layer 21a is present.

The touch panel illustration of FIG. 3 is of course only a single example, there are a wide variety of touch panels made with resistive or capacitive type sensing, that could utilize the transparent siloxane adhesive as disclosed herein. Also, the display need not be an LCD display, but could be an LED e.g. OLED display utilizing an optical adhesive. Nor need the display be a touch sensitive display, as the display could be any type of display, touch sensitive or not. For example, the siloxane material that is optically transmissive in the visible spectrum can be used in displays (e.g. LED displays such as OLED/AMOLED or LCD displays) which utilize an adhesive or encapsulant layer that is optically transparent. In particular, though not limited thereto, are touchscreen displays, such as resistive or capacitive touchscreens for smartphones, tablets, laptops and notebooks, computer monitors, as well as touchscreens on digital cameras, camcorders, portable game devices, personal multimedia players, e-book readers, printers, automotive displays, GPS/PND navigation devices, etc as well as touchscreens in retail, commercial and industrial environments. However non-touchscreen versions of such products may also benefit from the siloxane light transmissive materials as disclosed herein.

More particularly with regard to the siloxane composition referred to hereinabove, a composition is made where a siloxane polymer is provided. Preferably the polymer has a silicon oxide backbone, with aryl (or alkyl) substitutents as well as functional cross-linking substituents. A filler material is mixed with the siloxane polymer. The filler material is preferably particulate material comprising particles having an average particle size of 100 microns or less, preferably 10 microns or less. A catalyst is added, the catalyst being reactive with the functional cross-linking groups in the siloxane polymer when heat or UV light (or other activation method) is provided to the composition. A monomeric (or oligomeric) coupling agent(s) are included in the composition, preferably having functional cross-linking groups that are likewise reactive upon the application of heat or light as in the siloxane polymer. Additional materials such as stabilizers, antioxidants, dispersants, adhesion promoters, plasticizers, softeners, and other potential components, depending upon the final use of the composition, can also be added.

Though a solvent could be added, in a preferred embodiment the composition is solvent-free and is a viscous fluid without solvent which is stored and shipped as such.

As noted above, the composition being made as disclosed herein, comprises a siloxane polymer.

To make the siloxane polymer, a first compound is provided having a chemical formula $$SiR^1_a R^2_{4-a}$$

where
a is from 1 to 3,
$R^1$ is a reactive group, and
$R^2$ is an alkyl group or an aryl group.

Also provided is a second compound that has the chemical formula $$SiR^3_b R^4_c R^5_{4-(b+c)}$$

where
$R^3$ is a cross-linking functional group,
$R^4$ is a reactive group, and
$R^5$ is an alkyl or aryl group, and where
b=1 to 2, and c=1 to (4-b).

An optional third compound is provided along with the first and second compounds, to be polymerized therewith. The third compound may have the chemical formula $$SiR^9_f R^{10}_g$$

where
$R^9$ is a reactive group and
f=1 to 4, and where
$R^{10}$ is an alkyl or aryl group and
g=4-f.

The first, second and third compounds may be provided in any sequence, and oligomeric partially polymerized versions of any of these compounds may be provided in place of the above-mentioned monomers.

The first, second and third compounds, and any compounds recited hereinbelow, if such compounds have more than one of a single type of "R" group such as a plurality of aryl or alkyl groups, or a plurality of reactive groups, or a plurality of cross-linking functional groups, etc., the multiple R groups are independently selected so as to be the same or different at each occurrence. For example, if the first compound is $SiR^1_2 R^2_2$, the multiple $R^1$ groups are independently selected so as to be the same or different from each other. Likewise the multiple $R^2$ groups are independently selected so as to be the same or different from each other. The same is for any other compounds mentioned herein, unless explicitly stated otherwise.

A catalyst is also provided. The catalyst may be a base catalyst, or other catalyst as mentioned below. The catalyst provided should be capable of polymerizing the first and second compounds together. As mentioned above, the order of the addition of the compounds and catalyst may be in any desired order. The various components provided together are polymerized to create a siloxane polymeric material having a desired molecular weight and viscosity. After the polymerization, particles, such as microparticles, nanoparticles or other desired particles are added, along with other optional components such as coupling agents, catalyst, stabilizers, adhesion promoters, and the like. The combination of the components of the composition can be performed in any desired order.

More particularly, in one example, a siloxane polymer is made by polymerizing first and second compounds, where the first compound has the chemical formula $SiR^1_a R^2_{4-a}$ where a is from 1 to 3, $R^1$ is a reactive group, and $R^2$ is an alkyl group or an aryl group, and the second compound has the chemical formula $SiR^3_b R^4_c R^5_{4-(b+c)}$ where $R^3$ is a cross-linking functional group, $R^4$ is a reactive group, and $R^5$ is an alkyl or aryl group, and where b=1 to 2, and c=1 to (4-b).

The first compound may have from 1 to 3 alkyl or aryl groups ($R^2$) bound to the silicon in the compound. A combination of different alkyl groups, a combination of different aryl groups, or a combination of both alkyl and aryl groups is possible. If an alkyl group, the alkyl contains preferably 1 to 18, more preferably 1 to 14 and particularly preferred 1 to 12 carbon atoms. Shorter alkyl groups, such as from 1 to 6 carbons (e.g. from 2 to 6 carbon atoms) are envisioned. The alkyl group can be branched at the alpha or beta position with one or more, preferably two, C1 to C6 alkyl groups. In particular, the alkyl group is a lower alkyl containing 1 to 6 carbon atoms, which optionally bears 1 to 3 substituents selected from methyl and halogen. Methyl, ethyl, n-propyl, i-propyl, n-butyl, i-butyl and t-butyl, are particularly preferred. A cyclic alkyl group is also possible like cyclohexyl, adamantyl, norbornene or norbornyl.

If $R^2$ is an aryl group, the aryl group can be phenyl, which optionally bears 1 to 5 substituents selected from halogen, alkyl or alkenyl on the ring, or naphthyl, which optionally bear 1 to 11 substituents selected from halogen alkyl or alkenyl on the ring structure, the substituents being optionally fluorinated (including per-fluorinated or partially fluorinated). If the aryl group is a polyaromatic group, the polyaromatic group can be for example anthracene, naphthalene, phenanthere, tetracene which optionally can bear 1-8 substituents or can be also optionally 'spaced' from the silicon atom by alkyl, alkenyl, alkynyl or aryl groups containing 1-12 carbons. A single ring structure such as phenyl may also be spaced from the silicon atom in this way.

The siloxane polymer is made by performing a polymerization reaction, preferably a base catalyzed polymerization reaction between the first and second compounds. Optional additional compounds, as set forth below, can be included as part of the polymerization reaction.

The first compound can have any suitable reactive group $R^1$, such as a hydroxyl, halogen, alkoxy, carboxyl, amine or acyloxy group. If, for example, the reactive group in the first compound is an —OH group, more particular examples of the first compound can include silanediols such as diphenylsilanediol, dimethylsilanediol, di-isopropylsilanediol, di-n-propylsilanediol, di-n-butylsilanediol, di-t-butylsilanediol, di-isobutylsilanediol, phenylmethylsilanediol and dicyclohexylsilanediol among others.

The second compound can have any suitable reactive group $R^4$, such as a hydroxyl, halogen, alkoxy, carboxyl, amine or acyloxy group, which can be the same or different from the reactive group in the first compound. In one example, the reactive group is not —H in either the first or second compound (or any compounds that take part in the polymerization reaction to form the siloxane polymer—e.g. the third compound, etc.), such that the resulting siloxane polymer has an absence of any, or substantially any, H groups bonded directly to the Si in the siloxane polymer. Group $R^5$, if present at all in the second compound, is independently an alkyl or aryl groups such as for group $R^2$ in the first compound. The alkyl or aryl group $R^5$ can be the same or different from the group $R^2$ in the first compound.

The cross-linking reactive group $R^3$ of the second compound can be any functional group that can be cross-linked by acid, base, radical or thermal catalyzed reactions. These functional groups can be for example any epoxide, oxetane, acrylate, alkenyl or alkynyl group.

If an epoxide group, it can be a cyclic ether with three ring atoms that can be cross-linked using acid, base and thermal catalyzed reactions. Examples of these epoxide containing cross-linking groups are glycidoxypropyl and (3,4-Epoxy-cyclohexyl)ethyl) groups to mention few If an oxetane group, it can be a cyclic ether with four ring atoms that can be cross-linked using acid, base and thermal catalyzed reactions. Examples of such oxetane containing silanes include 3-(3-ethyl-3-oxetanylmethoxy)propyltriethoxysilane, 3-(3-Methyl-3-oxetanylmethoxy)propyltriethoxysilane, 3-(3-ethyl-3-oxetanylmethoxy)propyltrimethoxysilane or 3-(3-Methyl-3-oxetanylmethoxy)propyltrimethoxysilane, to mention a few.

If an alkenyl group, such a group may have preferably 2 to 18, more preferably 2 to 14 and particularly preferred 2 to 12 carbon atoms. The ethylenic, i.e. two carbon atoms bonded with double bond, group is preferably located at the position 2 or higher, related to the Si atom in the molecule. Branched alkenyl is preferably branched at the alpha or beta position with one and more, preferably two, C1 to C6 alkyl, alkenyl or alkynyl groups, optionally fluorinated or perfluorinated alkyl, alkenyl or alkynyl groups.

If an alkynyl group, it may have preferably 2 to 18, more preferably 2 to 14 and particularly preferred 2 to 12 carbon atoms. The ethylinic group, i.e. two carbon atoms bonded with triple bond, group is preferably located at the position 2 or higher, related to the Si or M atom in the molecule. Branched alkynyl is preferably branched at the alpha or beta position with one and more, preferably two, C1 to C6 alkyl, alkenyl or alkynyl groups, optionally per-fluorinated alkyl, alkenyl or alkynyl groups.

If a thiol group, it may be any organosulfur compound containing carbon-bonded sulfhydryl group. Examples of thiol containing silanes are 3-mercaptopropyltrimethoxysilane and 3-mercaptopropyltriethoxysilane.

The reactive group in the second compound can be an alkoxy group. The alkyl residue of the alkoxy groups can be linear or branched. Preferably, the alkoxy groups are comprised of lower alkoxy groups having 1 to 6 carbon atoms, such as methoxy, ethoxy, propoxy and t-butoxy groups. A particular examples of the second compound is an silane, such as 2-(3,4-Epoxycyclohexyl)ethyltrimethoxysilane, 2-(3,4-epoxycyclohexyl)ethyltriethoxysilane, 3-(Trimethoxysilyl)propylmethacrylate, 3-(Trimethoxysilyl)propylacrylate, (3-glycidyloxypropyl)trimethoxysilane, or 3-glycidoxypropyltriethoxysilane, 3-methacryloxypropyltrimethoxysilane, 3-acryloxypropyltrimethoxysilane, among others.

A third compound may be provided along with the first and second compounds, to be polymerized therewith. The third compound may have the chemical formula $SiR^9_fR^{10}_g$ where $R^9$ is a reactive group and f=1 to 4, and where $R^{10}$ is an alkyl or aryl group and g=4-f.

One such example is tetramethoxysilane. Other examples include phenylmethyldimethoxysilane, trimethylmethoxysilane, dimethyldimethoxysilanesilane, vinyltrimethoxysilane, allyltrimethoxysilane, methyltrimethoxysilane, methyltriethoxysilane, methyl tripropoxysilane, propylethyltrimethoxysilane, ethyltriethoxysilane, vinyltrimethoxysilane, vinyltriethoxysilane, among others.

Though the polymerization of the first and second compounds can be performed using an acid catalyst, a base catalyst is preferred. The base catalyst used in a base catalyzed polymerization between the first and second compounds can be any suitable basic compound. Examples of these basic compounds are any amines like triethylamine and any barium hydroxide like barium hydroxide, barium hydroxide monohydrate, barium hydroxide octahydrate, among others. Other basic catalysts include magnesium oxide, calcium oxide, barium oxide, ammonia, ammonium perchlorate, sodium hydroxide, potassium hydroxide, imidazone or n-butyl amine. In one particular example the base catalyst is $Ba(OH)_2$. The base catalyst can be provided, relative to the first and second compounds together, at a weight percent of less than 0.5%, or at lower amounts such as at a weight percent of less than 0.1%.

Polymerization can be carried out in melt phase or in liquid medium. The temperature is in the range of about 20 to 200° C., typically about 25 to 160° C., in particular about 40 to 120° C. Generally polymerization is carried out at ambient pressure and the maximum temperature is set by the boiling point of any solvent used. Polymerization can be carried out at refluxing conditions. Other pressures and temperatures are also possible. The molar ratio of the first compound to the second compound can be 95:5 to 5:95, in particular 90:10 to 10:90, preferably 80:20 to 20:80. In a preferred example, the molar ratio of the first compound to the second compound (or second plus other compounds that take part in the polymerization reaction—see below) is at least 40:60, or even 45:55 or higher.

In one example, the first compound has —OH groups as the reactive groups and the second compound has alkoxy groups as the reactive groups. Preferably, the total number of —OH groups for the amount of the first compound added is not more than the total number of reactive groups, e.g. alkoxy groups in the second compound, and preferably less than the total number of reactive groups in the second compound (or in the second compound plus any other compounds added with alkoxy groups, e.g. an added tetramethoxysilane or other third compound involved in the polymerization reaction, as mentioned herein). With the alkoxy groups outnumbering the hydroxyl groups, all or substantially all of the —OH groups will react and be removed from the siloxane, such as methanol if the alkoxysilane is a methoxysilane, ethanol if the alkoxysilane is ethoxysilane, etc. Though the number of —OH groups in the first compound and the number of the reactive groups in the second compound (preferably other than —OH groups) can be substantially the same, it is preferably that the total number of reactive groups in the second compound outnumber the —OH groups in the first compound by 10% or more, preferably by 25% or more. In some embodiments the number of second compound reactive groups outnumber the first compound —OH groups by 40% or more, or even 60% or more, 75% or more, or as high as 100% or more. The methanol, ethanol or other byproduct of the polymerization reaction depending upon the compounds selected, is removed after polymerization, preferably evaporated out in a drying chamber.

The obtained siloxane polymers have any desired (weight average) molecular weight, such as from 500 to 100,000 g/mol. The molecular weight can be in the lower end of this range (e.g., from 500 to 10,000 g/mol, or more preferably 500 to 8,000 g/mol) or the organosiloxane material can have a molecular weight in the upper end of this range (such as from 10,000 to 100,000 g/mol or more preferably from 15,000 to 50,000 g/mol). It may be desirable to mix a polymer organosiloxane material having a lower molecular weight with an organosiloxane material having a higher molecular weight.

The obtained siloxane polymer may then be combined with additional components depending upon the final desired use of the polymer. If desired, the siloxane polymer can be combined with a filler to form a composition, such as a particulate filler having particles with an average particle size of less than 100 microns, preferably less than 50 microns, including less than 20 microns. Additional components may be part of the composition, such as catalysts or curing agents, one or more coupling agents, dispersants, antioxidants, stabilizers, adhesion promoters, and/or other desired components depending upon the final desired use of the siloxane material. In one example, a reducing agent that can reduce an oxidized surface to its metallic form, is included. A reducing agent can remove oxidation from particles if they are metallic particles with surface oxidation, and/or remove oxidation from e.g. metallic bonding pads or other metallic or electrically conductive areas that have oxidized, so as to improve the electrical connection between the siloxane particle material and the surface on which it is deposited or adhered. Reducing or stabilization agents can include ethylene glycol, beta-D-glucose, poly ethylene oxide, glycerol, 1,2-propylene glycol, N,N dimethyl formamide, poly-sodium acyrylate (PSA), betacyclodextrin with polyacrylic acid, dihydroxy benzene, poly vinyl alcohol, 1,2-propylene glycol, hydrazine, hydrazine sulfate, Sodium borohydride, ascorbic acid, hydroquinone family, gallic acid, pyrogallol, glyoxal, acetaldehyde, glutaraldehyde, aliphatic dialdehyde family, paraformaldehyde, tin powder, zinc powder, formic acid. An additive such as a stabilization agent, e.g. an antioxidant such as Irganox (as mentioned hereinbelow) or a diazine derivative can also be added.

Cross-linking silicon or non-silicon based resins and oligomers can be used to enhance cross linking between siloxane polymers. The functionality of added cross-linking oligomer or resin is chosen by functionality of siloxane polymer. If for example epoxy based alkoxysilanes were used during polymerization of siloxane polymer, then epoxy functional oligomer or resin can be used. The epoxy oligomer or resin can be any di, tri, tetra, or higher functionality epoxy oligomer or resin. Examples of these epoxy oligomers or resins can be 1,1,3,3-tetramethyldisiloxane-1,3-bis2-(3,4-epoxycyclohexyl)ethyl, 1,1,3,3-tetramethyldisiloxane-1,3-bisglycidoxypropyl, Bis(3,4-epoxycyclohexylmethyl) adipate, 3,4-Epoxycyclohexylmethyl 3,4-epoxycyclohexanecarboxylate, 1,4-Cyclohexanedimethanol diglycidyl ether, Bisphenol A diglycidyl ether, Diglycidyl 1,2-cyclohexanedicarboxylate, to mention a few.

The curing agent added to the final formulation is any compound that can initiate and/or accelerate the curing process of functional groups in siloxane polymer. These curing agents can be either heat and/or UV activated (e.g. a thermal acid if the polymerization reaction is heat activated or a photoinitiator if UV activated). The cross-linking groups in the siloxane polymer, as mentioned above, are preferably epoxide, oxetane, acrylate, alkenyl or alkynyl groups. The curing agent is selected based on the cross-linking group in the siloxane polymer.

In one embodiment, the curing agent for epoxy and oxetane groups can be selected from nitrogen-containing curing agents, such as primary and/or secondary amines which show blocked or decreased activity. The definition "primary or secondary amines which show blocked or decreased reactivity" shall mean those amines which due to a chemical or physical blocking are incapable or only have very low capability to react with the resin components, but may regenerate their reactivity after liberation of the amine, e.g. by melting it at increased temperature, by removing sheath or coatings, by the action of pressure or of supersonic waves or of other energy types, the curing reaction of the resin components starts.

Examples of heat-activatable curing agent include complexes of at least one organoborane or borane with at least one amine. The amine may be of any type that complexes the organoborane and/or borane and that can be decomplexed to free the organoborane or borane when desired. The amine may comprise a variety of structures, for example, any primary or secondary amine or polyamines containing primary and/or secondary amines. The organoborane can be selected from alkyl boranes. An example of these heat particular preferred borane is boron trifluoride. Suitable amine/(organo)borane complexes are available from commercial sources such as King Industries, Air products, and ATO-Tech.

Other heat activated curing agents for epoxy groups are thermal acid generators which can release strong acids at elevated temperature to catalyze cross-linking reactions of epoxy. These thermal acid generators can be for example any onium salts like sulfonium and iodonium salts having complex anion of the type $BF_4^-$, $PF_6^-$, $SbF_6^-$, $CF_3SO_3^-$, and $(C_6F_5)_4B^-$. Commercial examples of these thermal acid generators are K-PURE CXC-1612 and K-PURE CXC-1614 manufactured by King Industries.

Additionally, with respect to epoxy and/or oxetane containing polymers, curing agent, co-curing agents, catalysts, initiators or other additives designed to participate in or promote curing of the adhesive formulation like for example, anhydrides, amines, imidazoles, thiols, carboxylic acids, phenols, dicyandiamide, urea, hydrazine, hydrazide, amino-formaldehyde resins, melamine-formaldehyde resins, quaternary ammonium salts, quaternary phosphonium salts, tri-aryl sulfonium salts, di-aryl iodonium salts, diazonium salts, and the like, can be used.

For acrylate, alkenyl and alkynyl cross linking groups curing agent can be either thermal or UV activated. Examples of thermal activated are peroxides and azo compounds. Peroxide is a compound containing unstable oxygen-oxygen single bond which easily split into reactive radicals via hemolytic cleavage. Azo compounds have R—N=N—R functional group which can decompose to nitrogen gas and two organic radicals. In both of these cases, the radicals can catalyze the polymerization of acrylate, alkenyl and alkynyl bonds. Examples of peroxide and azo compounds are di-tert-butyl peroxide, 2,2-Bis(tert-butylperoxy)butane, tert-Butyl peracetate, 2,5-Di(tert-butylperoxy)-2,5-dimethyl-3-hexyne, Dicumyl peroxide, Benzoyl peroxide, Di-tert-amyl peroxide, tert-Butyl peroxybenzoate, 4,4'-Azobis(4-cyanopentanoic acid), 2,2'-Azobis(2-amidinopropane) dihydrochloride, diphenyldiazene, Diethyl azodicarboxylate and 1,1'-Azobis(cyclohexanecarbonitrile) to mention a few.

Photoinitiators are compounds that decompose to free radicals when exposed to light and therefore can promote polymerization of acrylate, alkenyl and alkynyl compounds. Commercial examples of these photoinitiators are Irgacure 149, Irgacure 184, Irgacure 369, Irgacure 500, Irgacure 651, Irgacure 784, Irgacure 819, Irgacure 907, Irgacure 1700, Irgacure 1800, Irgacure 1850, Irgacure 2959, Irgacure 1173, Irgacure 4265 manufactured by BASF.

One method to incorporate curing agent to the system is to attach a curing agent or a functional group that can act as curing agent, to a silane monomer. Therefore the curing agent will accelerate curing of the siloxane polymer. Examples of these kind of curing agents attached to a silane monomer are to γ-lmidazolylpropyltriethoxysilane, γ-imidazolylpropyltrimethoxysilanel, 3-mercaptopropyltrimethoxysilane, 3-mercaptopropyltriethoxysilane, 3-(triethoxysilyl)propylsuccinicanhydride, 3-(trimethoxysilyl)

propylsuccinicanhydride, 3-aminopropyltrimethoxysilane and 3-aminopropyltriethoxysilane to mention a few.

An adhesion promoter can be part of the composition and can be any suitable compound that can enhance adhesion between cured product and surface where product has been applied. Most commonly used adhesion promoters are functional silanes where alkoxysilanes and one to three functional groups. Examples of adhesion promoter used in die attach products can be octyltriethoxysilane, mercaptopropyltriethoxysilane, cyanopropyltrimethoxysilane, 2-(3,4-Epoxycyclohexyl)ethyltrimethoxysilane, 2-(3,4-epoxycyclohexyl)ethyltriethoxysilane, 3-(Trimethoxysilyl)propylmethacrylate, 3-(Trimethoxysilyl)propylacrylate, (3-glycidyloxypropyl)trimethoxysilane, or 3-glycidoxypropyltriethoxysilane, 3-methacryloxypropyltrimethoxysilane and 3-acryloxypropyltrimethoxysilane.

The polymerized siloxane formed will have a [Si—O—Si—O]n repeating backbone, with organic functional groups thereon depending on the silicon containing starting materials. However it is also possible to achieve a [Si—O—Si—C]n or even a [Si—O—Me—O]n (where Me is a metal) backbone.

To obtain [Si—O—Si—C] backbone, a chemical with formula $R^2_{3-a}R^1_aSiR^{11}SiR^1_bR^2_{3-b}$ can be polymerized together with the first, second, and third compounds or any combination of these, as mentioned above, where a is from 1 to 3, b is from 1 to 3, $R^1$ is a reactive group like explained above, $R^2$ is an alkyl, alkenyl, alkynyl, alcohol, carboxylic acid, dicarboxylic acid, aryl, polyaryl, polycyclic alkyl, hetero cyclic aliphatic, hetero cyclic aromatic group and $R^{11}$ is independently an alkyl group or aryl group, or an oligomer thereof having a molecular weight of less than 1000 g/mol. Examples of these compound are 1,2-bis(dimethylhydroxylsilyl)ethane, 1,2-bis(trimethoxylsilyl)ethane, 1,2-Bis(dimethoxymethylsilyl)ethane, 1,2-Bis(methoxydimethylsilyl)ethane, 1,2-bis(triethoxylsilyl)ethane, 1,3-bis(dimethylhydroxylsilyl)propane, 1,3-bis(trimethoxylsilyl)propane, 1,3-Bis(dimethoxymethylsilyl)propane, 1,3-Bis(methoxydimethylsilyl)propane, 1,3-bis(triethoxylsilyl)propane, 1,4-bis(dimethylhydroxylsilyl)butane, 1,4-bis(trimethoxylsilyl)butane, 1,4-Bis(dimethoxymethylsilyl)butane, 1,4-Bis(methoxydimethylsilyl)butane, 1,4-bis(triethoxylsilyl)butane, 1,5-bis(dimethylhydroxylsilyl)pentane, 1,5-bis(trimethoxylsilyl)pentane, 1,5-Bis(dimethoxymethylsilyl) pentane, 1,5-bis(methoxydimethylsilyl)pentane, 1,5-bis(triethoxylsilyl)pentane, 1,6-bis(dimethylhydroxylsilyl)hexane, 1,6-bis(trimethoxylsilyl)hexane, 1,6-Bis(dimethoxymethylsilyl) hexane, 1,6-Bis(methoxydimethylsilyl)hexane, 1,6-bis(triethoxylsilyl)hexane 1,4-bis(trimethoxylsilyl)benzene, bis(trimethoxylsilyl)naphthalene, bis(trimethoxylsilyl)anthrazene, bis(trimethoxylsilyl)phenanthere, bis(trimethoxylsilyl)norbornene, 1,4-Bis(dimethylhydroxysilyl) benzene, 1,4-bis(methoxydimethylsilyl)benzene and 1,4-bis(triethoxysilyl)benzene to mention few.

In one embodiment to obtain [Si—O—Si—C] backbone, a compound with formula $R^5_{3-(c+d)}R^4_dR^3_cSiR^{11}SiR^3_eR^4_fR^5_{3-(e+f)}$ is polymerized together with the first, second, third compounds as mentioned herein, or any combinations of these, where $R^3$ is a cross-linking functional group, $R^4$ is a reactive group, and $R^5$ is an alkyl, alkenyl, alkynyl, alcohol, carboxylic acid, dicarboxylic acid, aryl, polyaryl, polycyclic alkyl, hetero cyclic aliphatic, hetero cyclic aromatic group, $R^{12}$ is independently an alkyl group or aryl group, and where c=1 to 2, d=1 to (3-c), e=1 to 2, and f=1 to (3-e), or an oligomer thereof having a molecular weight of less than 1000 g/mol. Examples of these compounds are 1,2-bis(ethenyldimethoxysilyl)ethane, 1,2-bis(ethynyldimethoxysilyl)ethane, 1,2-bis(ethynyldimethoxy)ethane, 1,2-bis(3-glycidoxypropyldimethoxysilyl)ethane, 1,2-bis[2-(3,4-Epoxycyclohexyl)ethyldimethoxysilyl]ethane, 1,2-bis(propylmethacrylatedimethoxysilyl)ethane, 1,4-bis(ethenyldimethoxysilyl)benzene, 1,4-bis(ethynyldimethoxysilyl)benzene, 1,4-bis(ethynyldimethoxysilyl)benzene, 1,4-bis(3-glycidoxypropyl dimethoxysilyl)benzene, 1,4-bis[2-(3,4-epoxycyclohexyl)ethyldimethoxysilyl]benzene, 1,4-bis(propyl methacrylate-dimethoxysilyl)benzene, to mention few.

In one embodiment a siloxane monomer with molecular formula $R^1_aR^2_bR^3_{3-(a+b)}Si—O—SiR^2_2—O—Si\ R^1_aR^2_bR^3_{3-(a+b)}$ where $R^1$ is reactive group like explained above, $R^2$ is alkyl or aryl like explained above, $R^3$ is cross linking functional group like explained above and a=0 to 3, b=0 to 3, is polymerized with previously mentioned silanes or added as an additive to the final formulation. Examples of these compounds are 1,1,5,5-tetramethoxy-1,5-dimethyl-3,3-diphenyltrisiloxane, 1,1,5,5-tetramethoxy-1,3,3,5-tetraphenyltrisiloxane, 1,1,5,5-tetraethoxy-3,3-diphenyltrisiloxane, 1,1,5,5-tetramethoxy-1,5-divinyl-3,3-diphenyltrisiloxane, 1,1,5,5-tetramethoxy-1,5-dimethyl-3,3-diisopropyltrisiloxane, 1,1,1,5,5,5-hexamethoxy-3,3-diphenyltrisiloxane, 1,5-dimethyl-1,5-diethoxy-3,3-diphenyltrisiloxane, 1,5-bis(mercaptopropyl)-1,1,5,5-tetramethoxy-3,3-diphenyltrisiloxane, 1,5-divinyl-1,1,5,5-tetramethoxy-3-phenyl-3-methyltrisiloxane, 1,5-divinyl-1,1,5,5-tetramethoxy-3-cyclohexyl-3-methyltrisiloxane, 1,1,7,7-tetramethyl-1,7-divinyl-3,3,5,5-tetramethyltetrasiloxane, 1,1,5,5-tetramethoxy-3,3-dimethyltrisiloxane, 1,1,7,7-tetraethoxy-3,3,5,5-tetramethyltetrasiloxane, 1,1,5,5-tetraethoxy-3,3-dimethyltrisiloxane, 1,1,5,5-tetramethoxy-1,5-[2-(3,4-epoxycyclohexyl)ethyl]-3,3-diphenyltrisiloxane, 1,1,5,5-tetramethoxy-1,5-(3-glycidoxypropyl)-3,3-diphenyltrisiloxane, 1,5-dimethyl-1,5-dimethoxy-1,5-[2-(3,4-epoxycyclohexyl)ethyl]-3,3-diphenyltrisiloxane, 1,5-dimethyl-1,5-dimethoxy-1,5-(3-glycidoxypropyl)-3,3-diphenyltrisiloxane to mention few examples.

An additive added to the composition (after polymerization of the siloxane material as noted above) can be a silane compound with formula of $R^1_aR^2_bSiR^3_{4-(a+b)}$ where $R^1$ is reactive group like hydroxyl, alkoxy or acetyloxy, $R^2$ is alkyl or aryl group, $R^3$ is crosslinking compound like epoxy, oxetane, alkenyl, acrylate or alkynyl group, a=0 to 1 and b=0 to 1. Examples of such additives are tri-(3-glycidoxypropyl)phenylsilane, tri-[2-(3,4-epoxycyclohexyl)ethyl]phenylsilane, tri-(3-methacryloxypropyl)phenylsilane, tri-(3-acryloxypropyl)phenylsilane, tetra-(3-glycidoxypropyl)silane, tetra-[2-(3,4-epoxycyclohexyl)ethyl]silane, tetra-(3-methacryloxypropyl)silane, tetra-(3-acryloxypropyl)silane, tri-(3-glycidoxypropyl)p-tolylsilane, tri-[2-(3,4-epoxycyclohexyl)ethyl]p-tolylsilane, tri-(3-methacryloxypropyl)p-tolylsilane, tri-(3-acryloxypropyl)p-tolylsilane, tri-(3-glycidoxypropyl)hydroxylsilane, tri-[2-(3,4-epoxycyclohexyl)ethyl]hydroxylsilane, tri-(3-methacryloxypropyl)hydroxylsilane, tri-(3-acryloxypropyl)hydroxylsilane.

The additives can be also any organic or silicone polymers that may react or may not react with the main polymer matrix therefore acting as plasticizer, softener, or matrix modifier like silicone. The additive can be also an inorganic polycondensate such as SiOx, TiOx, AlOx, TaOx, HfOx, ZrOx, SnOx, polysilazane.

The particulate filler if provided may be a conductive material, such as carbon black, graphite, graphene, gold, silver, copper, platinum, palladium, nickel, aluminum, silver plated copper, silver plated aluminum, bismuth, tin, bismuth-tin alloy, silver plated fiber, nickel plate copper, silver and nickel plated copper, gold plated copper, gold and nickel plated copper, or it may be gold, silver-gold, silver, nickel, tin, platinum, titanium plated polymer such as polyacrylate, polystyrene or silicone but not limited to these. The filler can be also a semiconductor material such as silicon, n or p type doped silicon, GaN, InGaN, GaAs, InP, SiC but not limited to these. Furthermore, the filler can be quantum dot or a surface plasmonic particle or phosphor particle. Other semiconductor particles or quantum dots, such as Ge, GaP, InAs, CdSe, ZnO, ZnSe, TiO2, ZnS, CdS, CdTe, etc. are also possible.

The filler can be particles that are any suitable metal or semi-metal particles such as those selected from gold, silver, copper, platinum, palladium, indium, iron, nickel, aluminum, carbon, cobalt, strontium, zinc, molybdenum, titanium, tungsten, silver plated copper, silver plated aluminum, bismuth, tin, bismuth-tin alloy, silver plated fiber or alloys or combinations of these. Metal particles that are transition metal particles (whether early transition metals or late transition metals) are envisioned, as are semi metals and metalloids. Semi-metal or metalloid particles such as arsenic, antimony, tellurium, germanium, silicon, and bismuth are envisioned.

Preferably however, if particles are provided, they are of a electrically nonconductive material, such as silica, quartz, alumina, aluminum nitride, aluminum nitride coated with silica, barium sulfate, alumina trihydrate, boron nitride, etc. The fillers can be the form of particles or flakes, and can be micro-sized or nano-sized. The filler may comprise ceramic compound particles that are nitrides, oxynitrides, carbides, and oxycarbides of metals or semimetals are possible. In particular, the filler can be particles that are ceramic particles that are an oxide of any of silicon, zinc, aluminum, yttrium, ytterbium, tungsten, titanium silicon, titanium, antimony, samarium, nickel, nickel cobalt, molybdenum, magnesium, manganese, lanthanide, iron, indium tin, copper, cobalt aluminum, chromium, cesium or calcium.

Also possible are particles that comprise carbon and are selected from carbon black, graphite, graphene, diamond, silicon carbonitride, titanium carbonitride, carbon nanobuds and carbon nanotubes. The particles of the filler can be carbide particles, such as iron carbide, silicon carbide, cobalt carbide, tungsten carbide, boron carbide, zirconium carbide, chromium carbide, titanium carbide, or molybdenum carbide. The particles could instead be nitride particles, such as aluminum nitride, tantalum nitride, boron nitride, titanium nitride, copper nitride, molybdenum nitride, tungsten nitride, iron nitride, silicon nitride, indium nitride, gallium nitride or carbon nitride.

Particles of any suitable size can be used, depending upon the final application. In many cases small particles having an average particle size of less than 100 microns, and preferably less than 50 or even 20 microns are used. Sub-micron particles, such as those less than 1 micron, or e.g. from 1 to 500 nm, such as less than 200 nm, such as from 1 to 100 nm, or even less than 10 nm, are also envisioned. In other examples, particles are provided that have an average particle size of from 5 to 50 nm, or from 15 to 75 nm, under 100 nm, or from 50 to 500 nm. Particles that are not elongated, e.g. substantial spherical or square, or flakes with a flattened disc shaped appearance (with smooth edges or rough edges) are possible, as are elongated whiskers, cylinders, wires and other elongated particles, such as those having an aspect ratio of 5:1 or more, or 10:1 or more. Very elongated particles, such as nanowires and nanotubes having a very high aspect ratio are also possible. High aspect ratios for nanowires or nanotubes can be at 25:1 or more, 50:1 or more, or even 100:1 or more. The average particle size for nanowires or nanotubes is in reference to the smallest dimension (width or diameter) as the length can be quite long, even up to centimeters long. As used herein, the term "average particle size" refers to the D50 value of the cumulative volume distribution curve at which 50% by volume of the particles have a diameter less than that value. In some transparent examples, it may be desirable to select an average particle size less than the minimum wavelength of light being transmitted therethrough, which for visible light would be preferably less than 400 nm, e.g. less than 200 nm or less than 100 nm.

To enhance the coupling with filler and siloxane polymer, a coupling agent can be used. This coupling agent will increase the adhesion between filler and polymer and therefore can increase thermal and/or electrical conductivity of the final product. The coupling agent can be any silane monomer with a formula of $R^{13}{}_h R^{14}{}_i SiR^{15}{}_j$ where $R^3$ is a reactive group like halogen, hydroxyl, alkoxy, acetyl or acetyloxy, $R^{14}$ is alkyl or aryl group and $R^{15}$ is a functional group including like epoxy, anhydride, cyano, oxetane, amine, thiol, allyl, alkenyl or alkynyl, h=0 to 4, I=0 to 4, j=0 to 4 and h+i+j=4. The coupling agent can be either mixed directly with filler, siloxane polymer, curing agent, and additives when final product is prepared or the filler particles can be treated by the coupling agent before they are mixed with particles.

If the particles are treated with coupling agent before using them in the final formulation, different methods like deposition from alcohol solution, deposition from aqueous solution, bulk deposition onto filler and anhydrous liquid phase deposition can be used. In the deposition from alcohol solution, alcohol/water solution is prepared and the solution pH is adjusted to slightly acidic (pH 4.5-5.5). Silane is added to this solution and mixed for few minutes to allow partly hydrolyzing. Then filler particles are added and the solution is mixed from to RT to refluxing temperature for different time periods. After mixing, the particles are filtered, rinsed with ethanol and dried in an oven to obtain surface treated particles by the coupling agent. Deposition from aqueous solution is similar compared to deposition from alcohol solution but instead of alcohol, pure water is used as a solvent. pH is again adjusted by acid if non amine functionalized is used. After mixing particles with water/silane mixture, the particles are filtered, rinsed and dried.

Bulk deposition method is a method where silane coupling agent is mixed with solvent without any water or pH adjustment. The filler particles are coated with the silane alcohol solution using different methods like spray coating and then dried in an oven.

In the anhydrous liquid phase deposition, silane are mixed with organic solvent like toluene, tetrahydrofuran or hydrocarbon and filler particles are refluxed in this solution and the extra solvent is removed by vacuum or filtering. The particles can be also dried afterwards in an oven but it is not sometimes need due to direct reaction between particles and filler under refluxing conditions.

Examples of such silane coupling agents are bis (2-hydroxyethyl)-3-aminopropyltriethoxysilane, Allyltrimethoxysilane, N-(2-Aminoethyl)-3-aminopropylmethyldimethoxysilane, N-(2-Aminoethyl)-3-aminopropyltrimethoxysilane, 3-Aminopropylmethyldiethoxysilane. 3-Aminopropyltriethoxysilane, 3-Aminopropyltrimethoxysilane, (N-Trimethoxysilylpropyl)polyethyleneimine, Trimethoxysilylpropyldiethylenetriamine, Phenyltriethoxysilane, Phenyltrimethoxysilane, 3-Chloropropyltrimethoxysilane, 1-Trimethoxysilyl-2(p,m-chloromethyl)phenylethane, 2-(3, 4-Epoxycyclohexyl)ethyltrimethoxysilane, 3-Glycidoxypropyltrimethoxysilane, Isocyanatepropyltriethoxysilane, Bis[3-(triethoxysilyl)propyl]tetrasulfide, 3-Mercaptopropylmethyldimethoxysilane, 3-Mercaptopropyltrimethoxysilane, 3-Methacryloxypropyltrimethoxysilane, 2-(Diphenylphosphino)ethyltriethoxysilane, 1,3-Divinyltetramethyldisilazane, Hexamethyldisilazane, 3-(N-Styrylmethyl-2-aminoethylamino)propyltrimethoxysilane, N-(Triethoxysilylpropyl)urea, 1,3-Divinyltetramethyldisilazane, Vinyltriethoxysilane and Vinyltrimethoxysilane to mention a few.

Depending on the type of particles added, the siloxane-particle cured final product can be a layer or film that is thermally conductive, such as having a thermal conductivity, after final heat or UV curing, of greater than 0.5 watts per meter kelvin (W/(m·K)). Higher thermal conductivity materials are possible, depending upon the type of particles selected. Particles in the siloxane composition can result in a cured final film having a thermal conductivity greater than 2.0 W/(m·K), such as greater than 4.0 W/(m·K), or even greater than 10.0 W/(m·K). Depending upon the final application, much higher thermal conductivity may be desired, such as greater than 50.0 W/(m·K), or even greater than 100.0 W/(m·K). However in other applications, particles may be selected to result, if desired, in a material having lower thermal conductivity, such as if the siloxane material is an optically transmissive layer, as mentioned above.

Also, if desired the final cured product can have low electrical resistivity, such as less than $1\times10^{-3}\Omega\cdot m$, preferably less than $1\times10^{-5}\Omega\cdot m$, and more preferably $1\times10^{7}\Omega\cdot m$. Also the sheet resistance of a deposited thin film is preferably less than 100,000, more preferably less than 10,000. However a number of desired final uses of the material may have high electrical resistivity.

In some cases, particularly if the composition will be applied in a device that requires optical characteristics, though it may be desirable in some cases for the final cured siloxane to have optically or reflecting properties, it is more likely that the material would desirably be highly transmissive to light in the visible spectrum (or in the spectrum in which the final device is operated). As an example of a transparent material, the final cured layer having a thickness of from 1 to 50 microns will transmit at least 85% of the visible light incident perpendicularly thereto, or preferably transmit at least 90%, more preferably at least 92.5% and most preferably at least 95%.

The material of the present invention may also contain a stabilizer and/or an antioxidant. These compounds are added to protect the material from degradation caused by reaction with oxygen induced by such things as heat, light, or residual catalyst from the raw materials. Among the applicable stabilizers or antioxidants included herein are high molecular weight hindered phenols and multifunctional phenols such as sulfur and phosphorous-containing phenol. Hindered phenols are well known to those skilled in the art and may be characterized as phenolic compounds which also contain sterically bulky radicals in close proximity to the phenolic hydroxyl group thereof. In particular, tertiary butyl groups generally are substituted onto the benzene ring in at least one of the ortho positions relative to the phenolic hydroxyl group. The presence of these sterically bulky substituted radicals in the vicinity of the hydroxyl group serves to retard its stretching frequency, and correspondingly, its reactivity; this hindrance thus providing the phenolic compound with its stabilizing properties. Representative hindered phenols include: 1,3,5-trimethyl-2,4,6-tris-(3,5-di-tert-butyl-4-hydroxybenzyl)-benzene; pentaerythrityl tetrakis-3(3,5-di-tert-butyl-4-hydroxyphenyl)-propionate; n-octadecyl-3(3,5-di-tert-butyl-4-hydroxyphenyl)-propionate; 4,4'-methylenebis (2,6-tert-butyl-phenol); 4,4'-thiobis(6-tert-butyl-o-cresol); 2,6-di-tertbutylphenol; 6-(4-hydroxyphenoxy)-2,4-bis(n-octyl-thio)-1,3,5 triazine; di-n-octylthio)ethyl 3,5-di-tert-butyl-4-hydroxy-benzoate; and sorbitol hexa[3-(3,5-di-tert-butyl-4-hydroxy-phenyl)-propionate]. Commercial examples of antioxidant are for example Irganox 1035, Irganox 1010, Irganox 1076, Irganox 1098, Irganox 3114, Irganox PS800, Irganox PS802, Irgafos 168 manufactured by BASF.

The weight ratio between siloxane polymer and particle filler can be between 100:0 to 5:95 depending of the final use of the product. The ratio between siloxane polymer and cross-linking silicon or non-silicon based resin or oligomer is between 100:0 to 75:25. The amount of curing agent calculated from siloxane polymer amount is from 0.1 to 20%. The amount of adhesion promoter based on total amount of formulation is from 0 to 10%. The amount of antioxidant based on total weight of the formulation is from 0 to 5%.

Depending upon the type of curing mechanism and catalyst activation the final formulation is cured usually by heating the material to higher temperature. For example if thermal acid generator is used, the material is placed in oven for specific time period. Also possible is curing with electromagnetic radiation, such as UV light.

The molecular weight of the siloxane polymer formed from polymerization of the first and second compounds is from about 300 to 10,000 g/mol, preferably from about 400 to 5000 g/mol, and more preferably from about 500 to 2000 g/mol. The polymer is combined with particles of any desired size, preferably having an average particle size of less than 100 microns, more preferably less than 50 microns, or even less than 20 microns. The siloxane polymer is added at a weight percent of from 10 to 90%, and the particles are added at a weight percent of from 1 to 90%. If the final use of the siloxane material requires optical transparency, the particles may be ceramic particles added at a lower weight percent, such as from 1 to 20% by weight. However higher loadings can also provide high transparency, including loadings of 75% by weight or more, such as with oxide particles with an average particle size less than visible light. If the siloxane material is to be used where electrical conductivity is desired, such as in a semiconductor package, the particles may be metal particles added at from 60 to 95% by weight.

Polymerization of the first and second compounds is performed, and the particles mixed therewith, to form a viscous fluid having a viscosity of from 50 to 100,000 mPa-sec, preferably from 1000 to 75,000 mPa-sec, and more preferably from 5000 to 50,000 mPa-sec. The viscosity can be measured with a viscometer, such as a Brookfield or Cole-Parmer viscometer, which rotates a disc or cylinder in a fluid sample and measures the torque needed to overcome the viscous resistance to the induced movement. The rotation can be at any desired rate, such as from 1 to 30 rpm, preferably at 5 rpm, and preferably with the material being measured being at 25° C.

After polymerization, any additional desired components can be added to the composition, such as particles, coupling agents, curing agents, etc. The composition is shipped to customers as a viscous material in a container, which may be shipped at ambient temperature without the need for cooling or freezing. As a final product, the material can be applied in the variety of uses mentioned above, typically being heat or UV cured to form a solid cured polymeric siloxane layer.

The composition as disclosed herein is preferably without any substantial solvent. A solvent may be temporarily added, such as to mix a curing agent or other additive with the polymerized viscous material. In such a case, the e.g. curing agent is mixed with a solvent to form a fluid material that can then be mixed with the viscous siloxane polymer. However, as a substantially solvent free composition is desired for shipping to customers, and later application on a customer's device, the solvent that has been temporarily added is removed in a drying chamber. There may however be trace amounts of solvent remaining that were not able to be removed during the drying process, though the composition is substantially free of solvent. This solvent removal aids in the deposition of the composition disclosed herein, by reducing shrinkage during the final curing process, as well as minimizing shrinkage over time during the lifetime of the device, as well as aiding thermal stability of the material during the lifetime of the device.

Knowing the final application of the composition, the desired viscosity of the composition, and the particles to be included, it is possible to fine tune the siloxane polymer (starting compounds, molecular weight, viscosity, etc.) such that, upon incorporation into the composition having particles and other components, the desired final properties are achieved for subsequent delivery to the customer. Due to the stability of the composition, it is possible to ship the composition at ambient temperature without any substantial change in molecular weight or viscosity, even after a one week, or even one month, time period from making till final use by the customer.

EXAMPLES

The following siloxane polymer examples are given by way of illustration and are not intended to be limitative The viscosity of siloxane polymer was measured by Brookfield viscometer (spindle 14). The molecular weight of the polymer was measured by Agilent GPC.

Siloxane polymer i: A 500 mL round bottom flask with stirring bar and reflux condenser was charged with diphenylsilanediol (60 g, 45 mol %), 2-(3,4-Epoxycyclohexyl)ethyl]trimethoxysilane (55.67 g, 36.7 mol %) and tetramethoxysilane (17.20 g, 18.3 mol %). The flask was heated to 80° C. under nitrogen atmosphere and 0.08 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated off under vacuum. The siloxane polymer had viscosity of 1000 mPas and Mw of 1100.

Siloxane polymer ii: A 250 mL round bottom flask with stirring bar and reflux condenser was charged with diphenylsilanediol (30 g, 45 mol %), 2-(3,4-Epoxycyclohexyl)ethyl]trimethoxysilane (28.1 g, 37 mol %) and dimethyldimethoxysilane (6.67 g, 18 mol %). The flask was heated to 80° C. under nitrogen atmosphere and 0.035 g of barium hydroxide monohydrate dissolved in 1 mL of methanol was added dropwise to the mixture of silanes. The silane mixture was stirred at 80 C for 30 min during the diphenylsilanediol reacted with alkoxysilanes. After 30 min, formed methanol was evaporated under vacuum. The siloxane polymer had viscosity of 2750 mPas and Mw of 896.

Siloxane polymer iii: A 250 mL round bottom flask with stirring bar and reflux condenser was charged with diphenylsilanediol (24.5 g, 50 mol %), 2-(3,4-Epoxycyclohexyl)ethyl]trimethoxysilane (18.64 g, 33.4 mol %) and tetramethoxysilane (5.75 g, 16.7 mol %). The flask was heated to 80° C. under nitrogen atmosphere and 0.026 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated under vacuum. The siloxane polymer had viscosity of 7313 mPas and Mw of 1328.

Siloxane polymer iv: A 250 mL round bottom flask with stirring bar and reflux condenser was charged with diphenylsilanediol (15 g, 50 mol %), 2-(3,4-Epoxycyclohexyl)ethyl]trimethoxysilane (13.29 g, 38.9 mol %) and bis(trimethoxysilyl)ethane (4.17 g, 11.1 mol %). The flask was heated to 80° C. under nitrogen atmosphere and 0.0175 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated under vacuum. The siloxane polymer had viscosity of 1788 mPas and Mw of 1590.

Siloxane polymer v: A 250 mL round bottom flask with stirring bar and reflux condenser was charged with diphenylsilanediol (15 g, 45 mol %), 2-(3,4-Epoxycyclohexyl)ethyl]trimethoxysilane (13.29 g, 35 mol %) and vinyltrimethoxysilane (4.57 g, 20 mol %). The flask was heated to 80° C. under nitrogen atmosphere and 0.018 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated off under vacuum. The siloxane polymer had viscosity of 1087 mPas and Mw of 1004.

Siloxane polymer vi: A 250 mL round bottom flask with stirring bar and reflux condenser was charged with di-isopropylsilanediol (20.05 g, 55.55 mol %), 2-(3,4-Epoxycyclohexyl)ethyl]trimethoxysilane (20.0 g, 33.33 mol %) and bis(trimethoxysilyl)ethane (7.3 g, 11.11 mol %). The flask was heated to 80° C. under nitrogen atmosphere and 0.025 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated off under vacuum. The siloxane polymer had viscosity of 150 mPas and Mw of 781.

Siloxane polymer vii: A 250 mL round bottom flask with stirring bar and reflux condenser was charged with di-isobutylsilanediol (18.6 g, 60 mol %) and 2-(3,4-Epoxycyclohexyl)ethyl]trimethoxysilane (17.32 g, 40 mol %). The flask was heated to 80° C. under nitrogen atmosphere and 0.019 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated off under vacuum. The siloxane polymer had viscosity of 75 mPas and Mw of 710.

Examples of End-capped Materials:

Example 1

Diphenylsilanediol (100.0 g, 0.46 mol), 3-(Trimethoxysilyl)propyl methacrylate (62.6 g, 0.25 mol), Methyl trimethoxysilane (17.2 g, 0.13 mol) and BaO (0.1 g) in methanol were placed in a 500 mL flask and refluxed for 1 hour. The volatiles were evaporated under reduced pressure and clear resin was obtained.

The weight average molecular weight (Mw) of the polymer was measured by Agilent GPC. The polysiloxane E1 has Mw of 1530 g/mol. FTIR analysis was performed to detect OH-groups and methoxy-groups. The polysiloxane E1 was substantially free of —OH groups (no peak observed at Si—OH band at 3390 cm-1). Remaining alkoxy groups can be observed as Si—OCH3 band at 2840 cm-1.

Example 2

25 g of polymer resin obtained from Example 1 was dissolved to 50 g acetone. 0.01 M HCl was added until solution was cloudy. Stirring continued at room temperature for 8 hours. Excess of water was added to precipitate polymer and after that polymer obtained was separated and dried. Polymer was dissolved into 30 g methyl tert-butyl ether (MTBE) and 5 g of hexamethyldisilazane was added followed by 0.05 g of pyridine hydrochloride. Stirring continued at room temperature for 24 hours. The non-reacted components were evaporated under reduced pressure and obtained resin was washed by using MTBE-water extractions. The solvent was evaporated under reduced pressure and clear resin (22.9 g) was obtained.

The polysiloxane E2 has Mw of 1670 g/mol. FTIR analysis was performed to detect OH-groups and methoxy-groups. In FTIR analysis, the polysiloxane E2 was substantially free of —OH groups, and Si—OCH3 peak at 2840 cm-1 was disappeared.

COMPOSITION EXAMPLES

The following composition examples are given by way of illustration and are not intended to be limitative.

Comparative Example 1

Silver filled adhesive: A siloxane polymer with epoxy as a crosslinking functional group (18.3 g, 18.3%), silver flake with average size (D50) of 4 micrometer (81 g, 81%), 3-methacrylatepropyltrimethoxysilane (0.5 g, 0.5%) and King Industries K-PURE CXC-1612 thermal acid generator (0.2%) where mixed together using high shear mixer. The composition has a viscosity of 15,000 mPas.

Comparative Example 2

Alumina filled adhesive: A siloxane polymer with epoxy as a crosslinking functional group (44.55 g, 44.45%), aluminium oxide with average size (D50) of 0.9 micrometer (53 g, 53%), 3-methacrylatepropyltrimethoxysilane (1 g, 1%), Irganox 1173 (1 g, 1%) and King Industries K-PURE CXC-1612 thermal acid generator (0.45 g, 0.45%) where mixed together using three roll mill. The composition has a viscosity of 20,000 mPas.

Comparative Example 3

BN filled adhesive: A siloxane polymer with epoxy as a crosslinking functional group (60 g, 60%), boron nitride platelet with average size (D50) of 15 micrometer (35 g, 35%), Irganox 1173 (1.3 g, 1.3%), 2-(3,4-Epoxycyclohexyl) ethyltrimethoxysilane (3.4 g, 3.4%) and King Industries K-PURE CXC-1612 thermal acid generator (0.3 g, 0.3%) where mixed together using three roll mill. The composition has a viscosity of 25,000 mPas.

Comparative Example 4

Translucent material: A siloxane polymer with methacrylate as a functional group (89 g, 89%), fumed silica with average size (D50) of 0.007 micrometer (5 g, 5%), Irganox 1173 (2 g, 2%) and Irgacure 917 photoinitiator (4 g, 4%) where mixed together using three roll mill. The composition has a viscosity of 25,000 mPas.

Comparative Example 5

Transparent material: Diphenylsilanediol (20.0 g, 92 mmol), 9-phenanthrenyl trimethoxysilane (16.6 g, 56 mmol), 3-methacryloxypropyltrimethoxysilane (9.2 g, 37 mmol) and BaO (25 mg) in methanol were placed in a 100 mL flask and refluxed for 1 hour. The volatiles were evaporated under reduced pressure. Clear polymer resin (37 g) was obtained.

Comparative Example 6

High refractive index material: 8.6 g polymer resin having a high index of refraction, prepared as described in Example X1, was blended with 5.7 g ZrO2 nanoparticle solution in 1,2-propanediol monomethyl ether acetate (PGMEA) having a solid content of 50%. 0.26 g photoinitiator (Darocur 1173 by BASF), 0.4 g of oligomeric 3-methacryloxypropyltrimethoxysilane as an adhesion promoter, and 20 mg surfactant (BYK-307 by BYK Chemie) were added to the solution. The obtained material was spin-coated on a 100 mm silicon wafer at 2000 rpm. The film was baked at 80° C. 5 min on a hot plate and UV-cured with dose of 3000 mJ/cm2. The refractive index was adjusted by altering the weight ratio of polymer resin and the ZrO2 nanoparticle.

TABLE

| Sample | Weight ratio | Refractive index (at 633 nm) | Refractive index (at 450 nm) | Transmittance (%, ca. 30 μm film; at 450 nm) |
|---|---|---|---|---|
| 1. Resin:ZrO2 | 1:0 | 1.61 | 1.64 | 98.6 |
| 2. Resin:ZrO2 | 3:1 | 1.63 | 1.66 | 98.3 |
| 3. Resin:ZrO2 | 1:1 | 1.67 | 1.70 | 97.5 |
| 4. Resin:ZrO2 | 1:3 | 1.72 | 1.75 | 96.1 |

If the siloxane composition as disclosed herein is disposed within the optical path of the light emitted by the LED and is selected so as to be optically transmissive to visible light, the refractive index can be selected based on the siloxane material chosen. An index of refraction of from 1.25 to 2.0 can be provided, e.g. from 1.4 to 1.7, or other desired number (1.5 to 1.9, 1.25 to 1.45, etc.), with the index of refraction being measured at 632.8 nm wavelength). Higher refractive indices, e.g. those higher than glass such as from 1.6 to 2.0, can be achieved by providing a metal containing monomer to be polymerized into the siloxane polymer. As mentioned above, it is possible to achieve a [Si—O-Me-O]n (where Me is a metal) backbone. Metal containing monomers, with metals such as titanium, tantalum, aluminum, zirconium, hafnium or selenium, among others, can help to increase the index of refraction. Such metal containing monomers can be used in place of the first, second or third compounds as mentioned hereinabove, or as an addition thereto.

Also, it is possible to increase the index of refraction based on the selection of particles (alternatively or in addition to the incorporation of metal into the siloxane polymer as mentioned above). Particular oxide particles, such as oxides of titanium, tantalum, aluminum, zirconium, hafnium or selenium, among others, can help to increase the refractive index. In addition, a coupling agent that improves the incorporation of the particles into the siloxane polymer can be selected to aid in the increase of the refractive index. As one example, a coupling agent having the chemical formula $(R^{16}Ar)_iSiR^1_j$ where i=1 or 2, and j=4-I, where $R_{16}$ is a functional cross linking group that undergoes cross linking with the siloxane polymer upon the application of heat or UV light, where Ar is an aryl group, and where $R_1$ is a reactive group, such as a hydroxyl, halogen, alkoxy, carboxyl, amine or acyloxy group. As such the compound comprises a silicon atom bonded to one or two aryl groups (which aryl groups have a cross-linking substituent) and where the silicon atom is also bonded to two or three reactive groups, preferably alkoxy groups. The aryl group can be phenyl, naphthalene, phenanthrene, anthracene, etc and the $R_{16}$ functional cross-linking group can be epoxy, acrylate, vinyl, allyl, acetylene, alcohol, amine, thiol, silanol, etc. The coupling agent may also be selected to have a metal atom, such as titanium, tantalum, aluminum, zirconium, hafnium or selenium etc in place of silicon.

Though no solvent is necessary for the application of the siloxane composition, if very thin layers are desired, it may be desirable to add an organic solvent, non polar or polar (protic or aprotic), so as to provide the siloxane material as a low viscosity liquid in order to minimize the deposited layer's thickness. Lowering the molecular weight of the siloxane polymer that is part of the composition, or using monomers (e.g. the first, second and/or third compounds) in place of the siloxane polymer in the composition, can lower the viscosity and aid in minimizing the film thickness (and thus increase light transmissivity) if desired. Surfactants and UV sensitive additives that enable the siloxane composition to react upon exposure to UV light can be added. Selecting the functional reactive group as acrylate can aid in polymerization under UV light.

The siloxane material can be deposited as a fluid, e.g. a liquid or gel, preferably dispensed by a process such as syringe deposition or screen printing. Other deposition methods could be used, such as spin-on, dip, ink-jet, curtain, drip, roller, gravure, reverse offset, extrusion coating, slit coating, spray coating, flexo-graphic, etc. Also, the substrate on which the siloxane material is deposited may or may not have been singulated from a wafer, but could instead be a whole wafer prior to singulation, or a portion cut from large sheets, such as large glass sheets used for display panels, solar cells, or the like. Depositing on large sheets in a roll to roll process is possible. Furthermore, a die substrate could be adhered to a package support substrate at the wafer level, with both the substrates singulated together into individual die. For displays, desirable is a deposition method that can be incorporated into a roll to roll process.

The transparent encapsulant, passivation layer, insulating layer or adhesive is preferably cured at low temperature and/or with UV light. If temperature cured, preferably the temperature is less than 125° C., more preferably less than 115° C., such as less than 105° C. If UV cured, ultraviolet light from a UV lamp is directed at the layer and cures the layer without the application of heat. However both heat and UV light can be used together if desired, and depending upon the types of reactive groups and initiators in the siloxane polymer as deposited. It is also possible to pattern the siloxane layer by selectively directing UV light via a mask or patterned photoresist, followed by application of a developer to remove unexposed regions.

Figure 4:
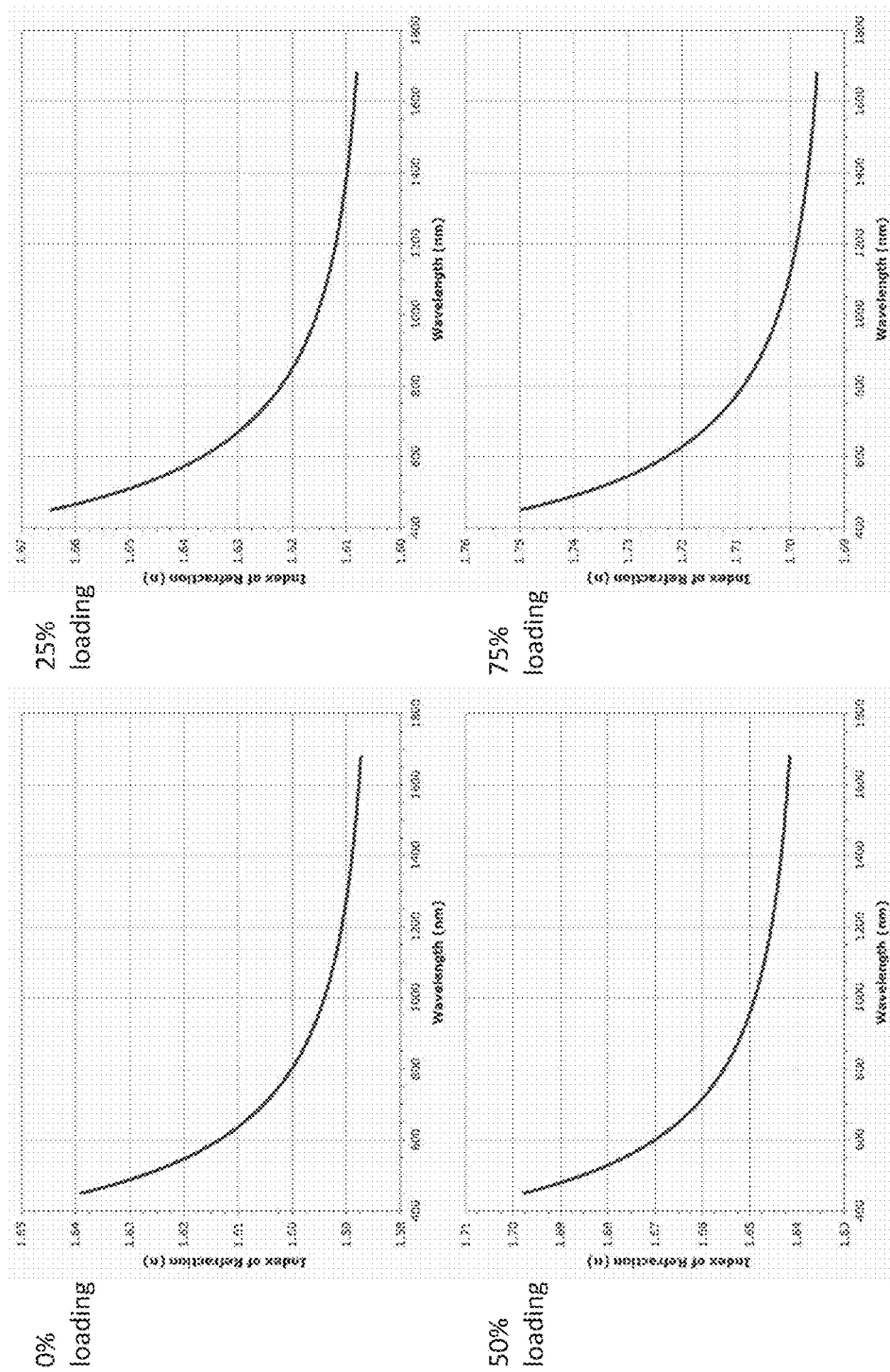
FIG. 4 shows graphs of refractive index vs wavelength for different particle loadings.
Figure 5:
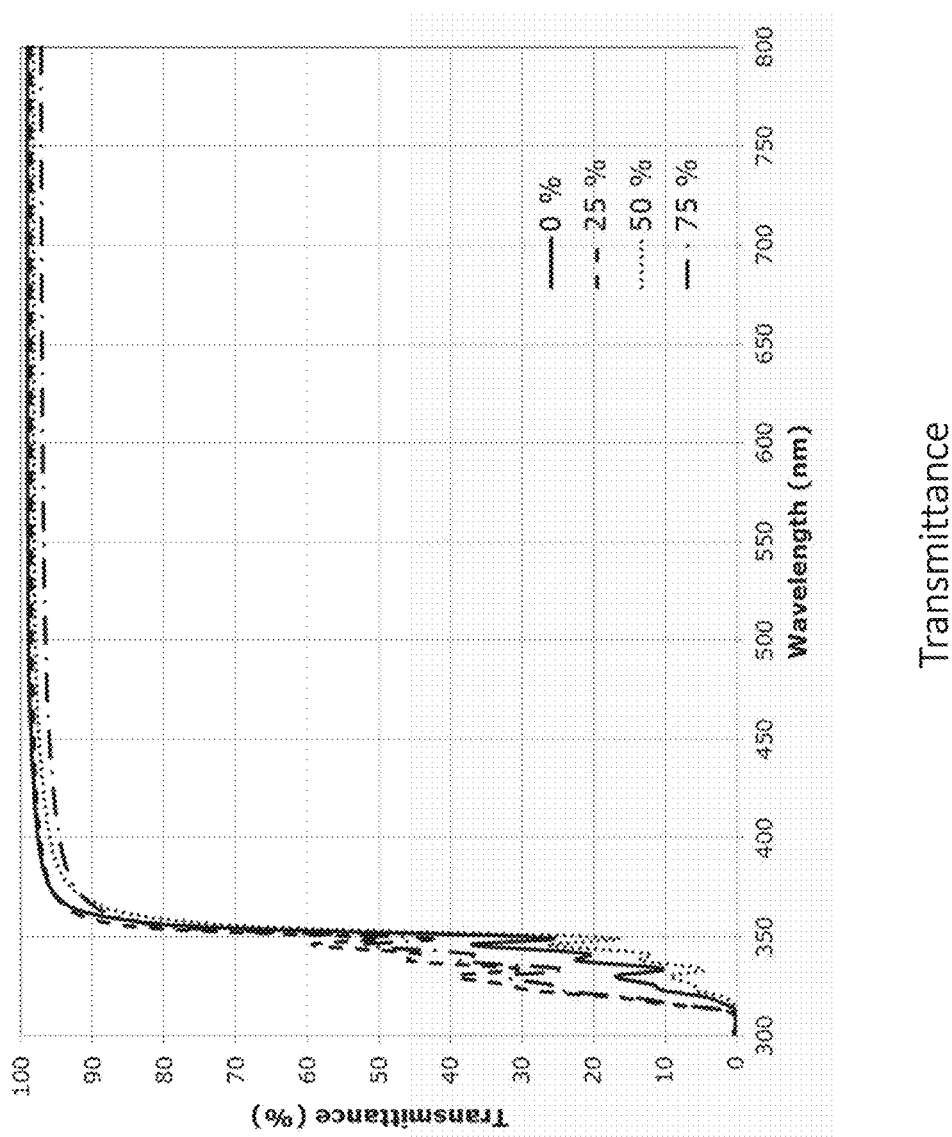
FIG. 5 is a graph of the transmittance vs particle loading.

As can be seen in FIG. 4, the index of refraction of the cured siloxane material (with particles) as disclosed herein is plotted vs wavelength of light, and with each graph having a different amount of particles as part of the siloxane material—from no particles added to the composition, to 75% loading. As can be seen in FIG. 4, an index of refraction of 1.60 or more in the visible spectrum can be achieved with no particles, and an index of refraction in the visible spectrum of 1.70 or more can be achieved with particles in this example. As can be seen in FIG. 5, the % transmittance of the siloxane material is plotted vs. wavelength of light. As illustrated in this figure, different loadings of particles, from no particles to 75% are plotted and in the visible spectrum have a % transmittance of visible light of greater than 90% (in fact greater than 95%). As such, the siloxane material even loaded with a high % of particles, is very transparent and useful in a variety of optical applications such as LED lamps.

In view of the disclosed methods and materials, a stable composition is formed. The composition may have one part that is a siloxane polymer having a [—Si—O—Si—O]n repeating backbone (or [Si—O-Me-O]n backbone), with alkyl or aryl groups thereon, and functional cross-linking groups thereon, and another part that is particles mixed with the siloxane material, wherein the particles have an average particle size of less than 100 microns, the particles being any suitable particles such as metal, semi-metal, semiconductor or ceramic particles. The composition as shipped to customers may have a molecular weight of from 300 to 10,000 g/mol, and a viscosity of from 1000 to 75,000 mPa-sec at 5 rpm viscometer.

Figure 6:
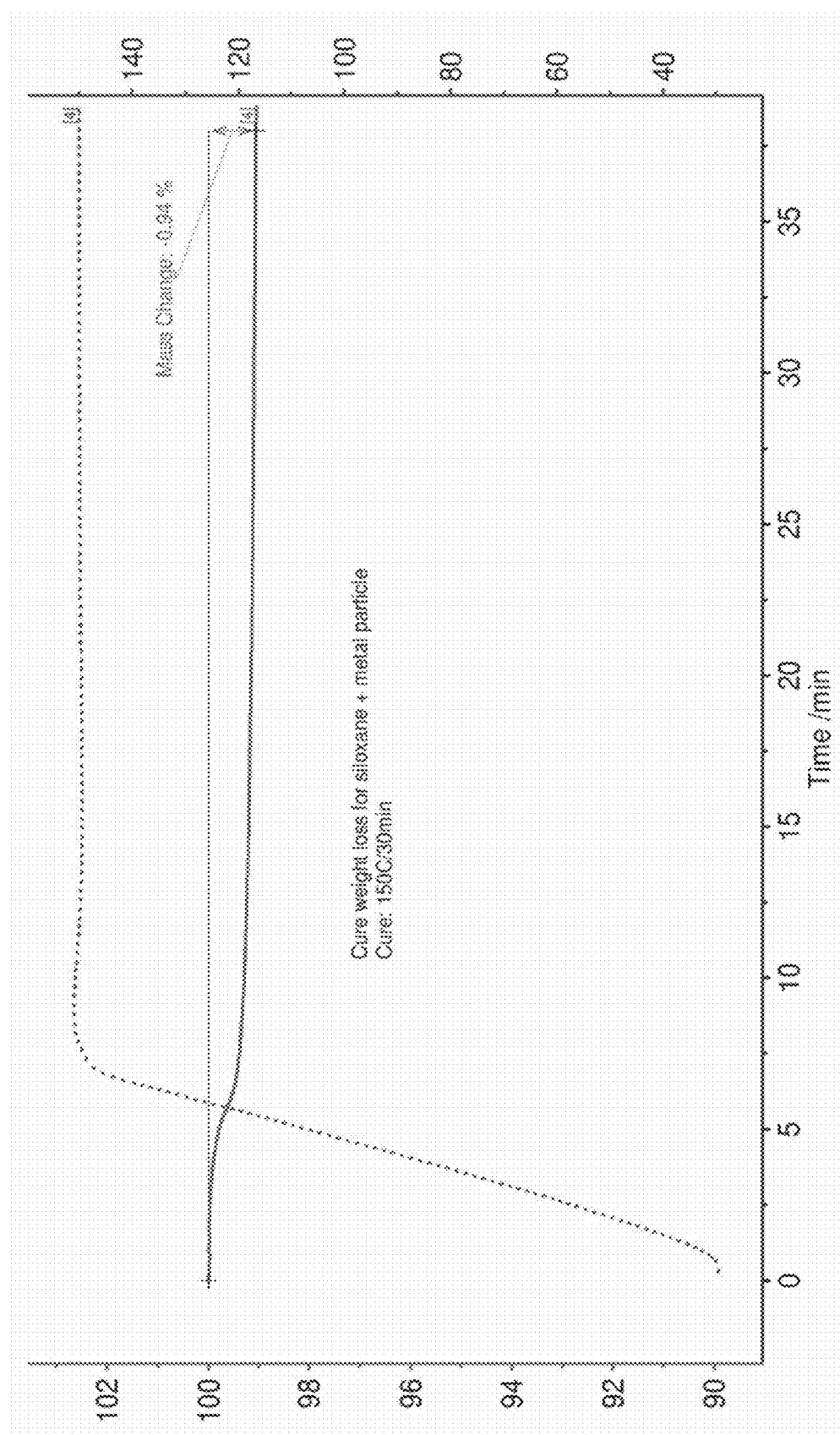
FIG. 6 illustrates mass change of the siloxane polymer during heat induced polymerization.

When the composition is deposited and polymerized, e.g. by the application of heat or UV light, very small shrinkage or reduction in mass is observed. In FIG. 6, the x-axis is time (in minutes), the left y axis is the mass of the layer in terms of % of the starting mass, and the right y-axis is temperature in Celsius. As can be seen in FIG. 6, a siloxane particle mixture as disclosed herein is heated rapidly to 150° C., then held at 150 C for approximately 30 minutes. In this example, the siloxane particle has a Si—O backbone with phenyl group and epoxy groups, and the particles are silver particles. The mass loss is less than 1% after heat curing for over this time period. Desirably the mass loss is typically less than 4%, and generally less than 2%—however in many cases the difference in mass of the siloxane particle composition between before and after curing is less than 1%. The curing temperature is generally at less than 175° C., though higher curing temperatures are possible. Typically the curing temperature will be at 160° C. or below, more typically at 150° C. or below. However lower curing temperatures are possible, such as at 125° C. or below.

Figure 7:
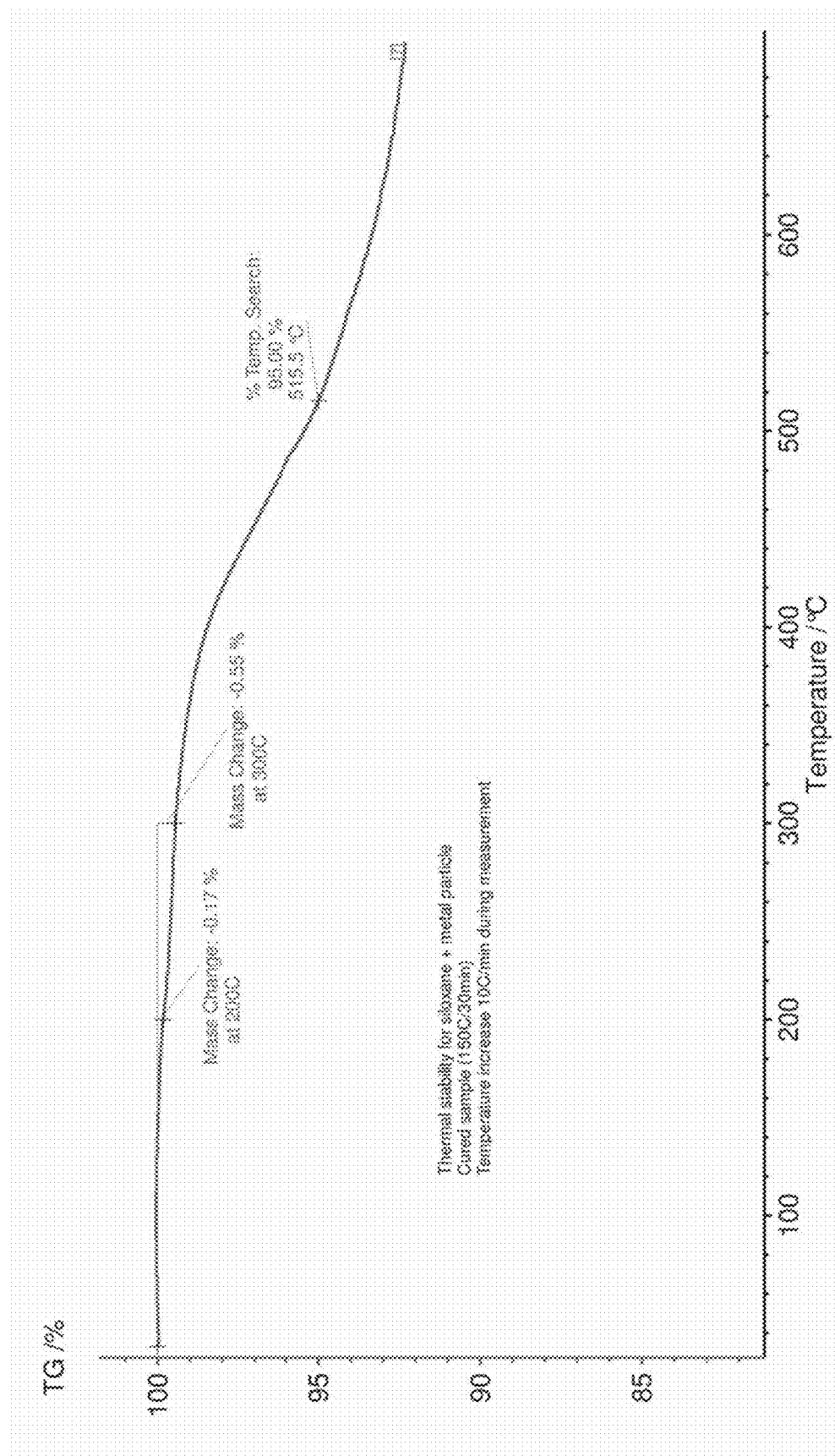
FIG. 7 illustrates the thermal stability of the siloxane material after deposition and polymerization.

As can be seen in FIG. 7, regardless of whether the composition disclosed above is used as an adhesive, as a thermally conductive layer, as an encapsulant, as a patterned electrically conductive layer, a patterned dielectric layer, a transparent layer, a light reflecting layer, etc., once the composition is deposited and polymerized and hardened as desired, the siloxane particle layer or mass is thermally very stable. As an example, heating the in situ material after hardening by heat or UV polymerization up to 600° C. at a ramp rate of 10 C increase per minute, a mass loss of less than 4.0%, preferably less than 2.0%, e.g. less than 1.0% is observed at both 200° C. and 300° C. (typically a mass loss of less than 0.5% is observed at 200° C., or as in the example of FIG. 7, a mass loss of less than 0.2% at 200° C. is observed). At 300° C., a mass loss of less than 1% is observed in the example of FIG. 7, or more particularly less than 0.6%. Similar results can be observed by simply heating the polymerized material for 1 hour at 200° C., or at 300° C. Results of less than 1% mass loss by heating the polymerized deposited material at 375° C. or more for at least 1 hour are possible.

As can be seen in FIG. 7, even at temperatures of greater than 500° C., a mass loss of 5% or less is observed. Such a thermally stable material is desirable, particularly one as disclosed herein that can be deposited at low temperatures (e.g. less than 175° C., preferably less than 150° C., or less than 130° C. at e.g. 30 min curing/baking time), or that can be polymerized by UV light.

As can be seen from the above disclosure, the siloxane material as disclosed hereinabove can be used as an adhesive, as a protection layer, a barrier layer, as part of a wavelength shifting layer, an insulating layer, or as visible light directing lens, among other implementations. The material is preferably not optically absorbing in the visible spectrum, and preferably transmits at least 75% of the visible light (or UV light if UV light is used) incident thereon, though preferably more than 80%, or more than 85%, or even higher such as more than 90 or 95%. As a wavelength shifting layer, phosphors, lumophors, scintillants or other chemical elements can be incorporated therein and which absorb light at one wavelength and emit light at a second different wavelength. Such wavelength shifting elements can be as part of a first siloxane composition layer proximate a second lens or encapsulation layer comprising the siloxane composition absent any wavelength shifting elements.

Alternatively, the encapsulant may comprise both the siloxane composition and wavelength shifting elements such as phosphors. It is also possible for the siloxane composition to be present as a transparent electrically conductive material, such as for flip chip die attach bumps, or for connecting wire bonds between substrates. Electrically conductive and patterned areas (e.g. as an ITO replacement layer) may also comprise the siloxane material according to the disclosure, however preferred are non electrically conductive and transparent materials.

The viscous (or liquid) siloxane polymer is substantially free of —OH groups, thus providing increased shelf-life, and allowing for storing or shipping at ambient temperature if desired. Preferably, the siloxane material has no —OH peak detectable from FTIR analysis thereof. The increased stability of the formed siloxane material allows for storage prior to use where there is a minimal increase in viscosity (cross-linking) during storage, such as less than 25% over the period of 2 weeks, preferably less than 15%, and more preferably less than 10% over a 2 week period stored at room temperature. And, the storage, shipping and later application by the customer can be all performed in the absence of a solvent (except for possible trace residues that remain after drying to remove the solvent), avoiding the problems of solvent capture in the layer later formed in the final product, shrinkage during polymerization, mass loss over time during device usage, etc. No substantial cross-linking occurs during shipping and storage, without the application of heat preferably greater than 100 C or UV light.

Figure 8:
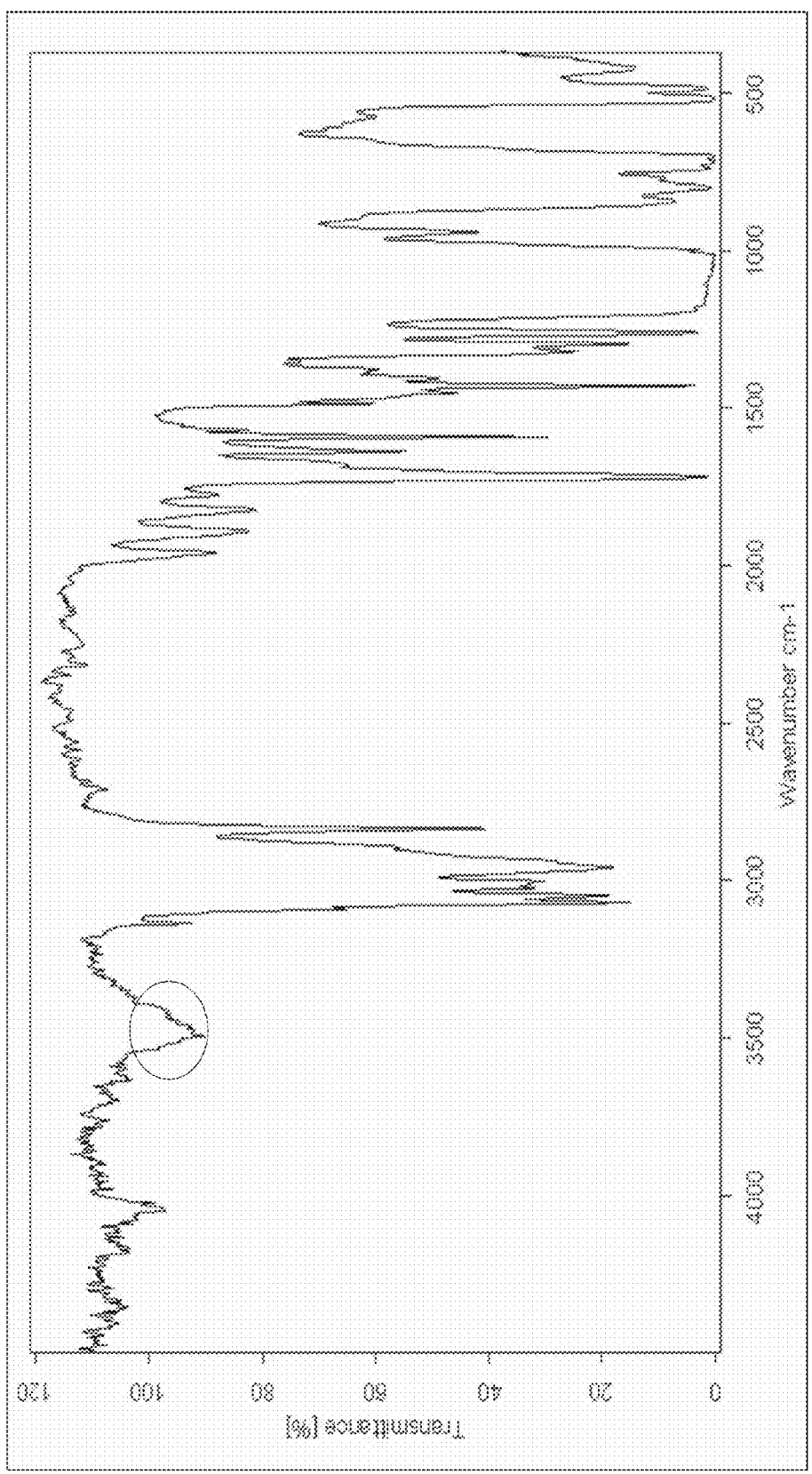
FIG. 8 is an FTIR plot of a base catalyzed siloxane material (without particles) showing substantial lack of —OH and Si—H in the material.
Figure 9:
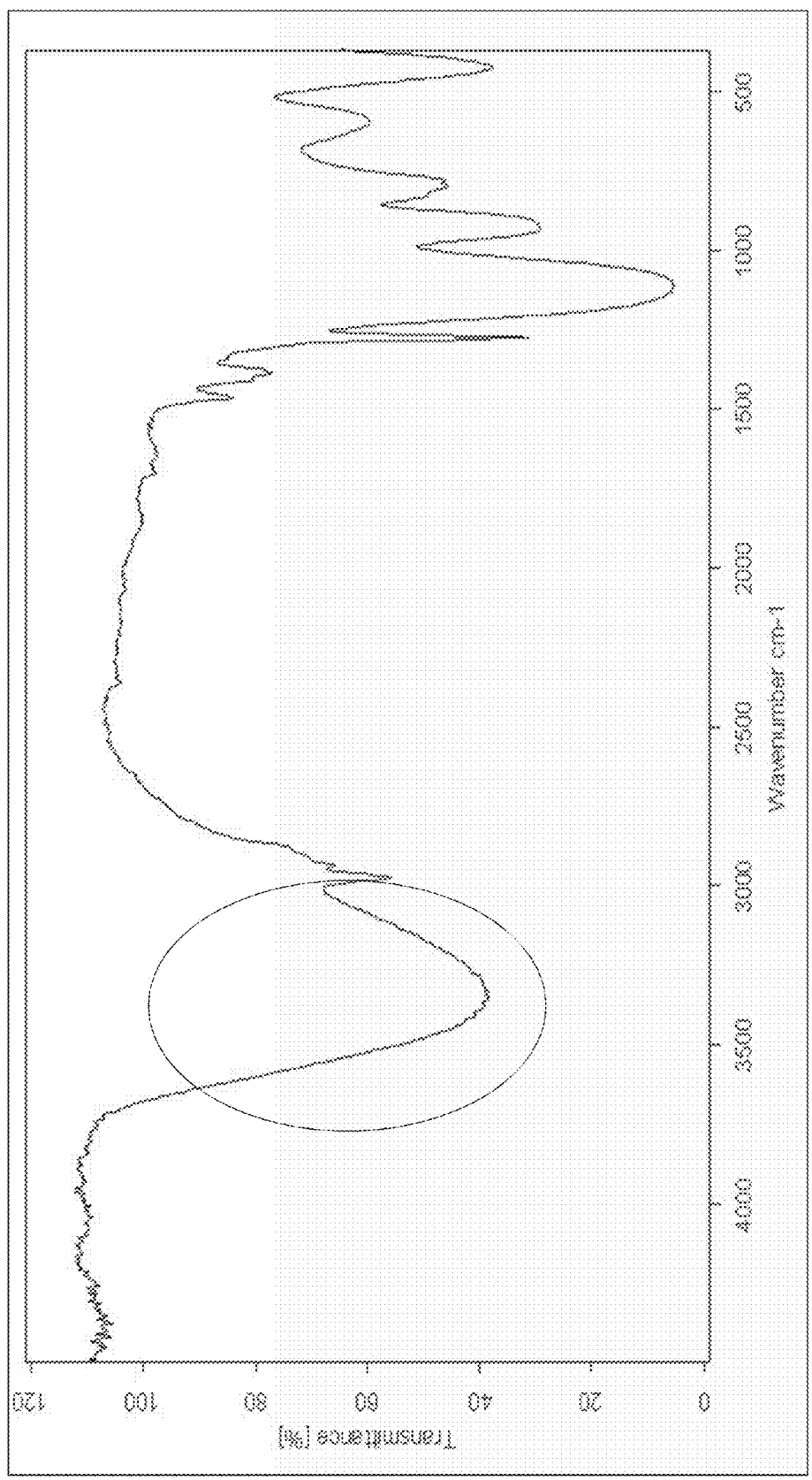
FIG. 9 is an FTIR plot of an acid catalyzed siloxane material as a comparison.

As can be seen in FIG. 8, an FTIR plot of the polymerized viscous material, without particles, is shown. As can be seen in this figure, a very small —OH absorption signal appears at wavenumber 3200-3600 $cm^{-1}$. This shows minute amounts of OH groups in the polymer material, corresponding to less than 5 mol % of all groups attached to silicon atoms, or less than 3%, or e.g. less than 2% etc. In comparison, a typical siloxane material would have a much larger mol % of OH groups therein—such as can be seen in FIG. 9 where a very large absorption signal corresponding to OH groups appears at 3200-3600 $cm^{-1}$.

Figure 10:
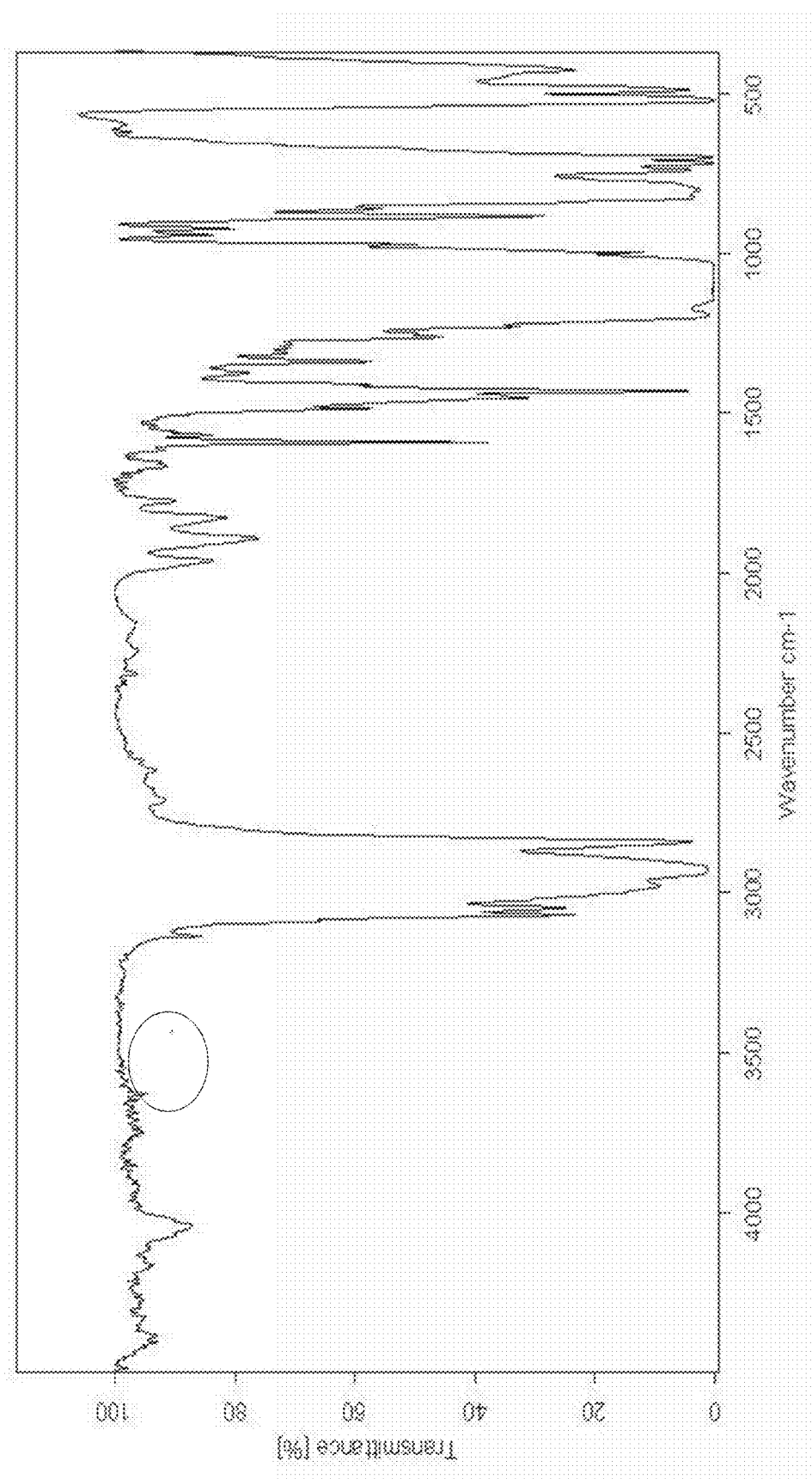
FIG. 10 is an FTIR plot of the base catalyzed siloxane material after deposition and curing.

As can also be seen in FIG. 10, once the siloxane polymer disclosed herein is deposited and cured as a hardened film, no OH peak appears at all. It should also be noted that the lack of an absorption peak at 2200 $cm^{-1}$ also shows a lack of Si—H bonds in FIGS. 8 and 10, as the siloxane material disclosed herein does not have Si—H bonds in the material, whether before or after deposition and curing.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

INDUSTRIAL APPLICABILITY

The compositions disclosed can be used as encapsulants in LED lights and lamps. The present LED lamps have a large variety of uses, for example as outdoor signs, LED pixel arrays for flat panel displays, LED backlighting for LCD displays, indoor screens for public events and public transportation, outdoor screens such as large screens at sporting or other public events, indoor and outdoor advertising screens, LED lights on consumer electronic products or any apparatus, device or machinery for that matter, infrared LEDs such as in remote controls, LEDs in traffic signals and road lighting, automobile tail lights, head lights and internal lighting, flashlights, greenhouse lighting for growing agricultural products indoors, and in general as a replacement for wherever incandescent bulbs or fluorescent lighting are used, among other implementations. LEDs will dominate the field of lighting for the foreseeable future and play an important role in energy-saving, environmental protection, and improvement in the quality of life.

CITATION LIST

Patent Literature

US 2004010676
U.S. Pat. No. 6,984,483
US 20130165615
U.S. Pat. No. 5,300,608

What is claimed is:

1. A siloxane polymer film formed on a substrate comprising:
   a UV-cured siloxane polymer film held on a substrate, which film is transmissive to visible light with an optical transmissivity of 95% or more in the visible spectrum, and wherein the siloxane polymer has less than 5% of Si—OH groups compared to all groups bound to Si therein, and substantially no Si—H bonds, wherein the film is a part of a display, a touch screen display, part of an OLED device, or part of a LCD display.

2. The film of claim 1, further comprising particles within the siloxane polymer film having an average particle size of less than 1 micron.

3. The film of claim 1, having an index of refraction of from 1.3 to 1.45 at 632.8 nm wavelength.

4. The film of claim 1, having an index of refraction of 1.65 or higher at 632.8 nm wavelength.

5. The film of claim 1, wherein after simultaneous 10,000,000 mJ of 365 nm UV wavelength exposure and 72 hours of heating at 150 C, the optical transmission degradation in the visible spectrum is less than 5%.

6. The film of claim 1, wherein the film has an optical birefringence of less than 0.01.

7. The film of claim 2, wherein the particles have an average particle size of less than 400 nm.

8. The film of claim 2, wherein the particles comprise titanium oxide, aluminum oxide, aluminum nitride, or boron nitride.

9. The film of claim 2, wherein the particles are ceramic particles selected from the group consisting of oxide particles and nitride particles.

10. The film of claim 2, wherein the particles comprise an oxide of silicon, zinc, aluminum, yttrium, ytterbium, tungsten, titanium silicon, titanium, antimony, samarium, nickel, nickel cobalt, molybdenum, magnesium, manganese, lanthanide, iron, indium tin, copper, cobalt aluminum, chromium, cesium or calcium, or aluminum nitride, tantalum nitride, boron nitride, titanium nitride, copper nitride, molybdenum nitride, tungsten nitride, iron nitride, silicon nitride, indium nitride, gallium nitride or carbon nitride.

11. The film of claim 2, wherein the particles are nanoparticles having an average particle size of less than 400 nm and wherein the nanoparticles are an oxide of titanium, tantalum, aluminum, zirconium, hafnium or selenium.

12. The film of claim 1, wherein the substrate comprises glass, quartz, sapphire, organic polymer or hybrid organic-inorganic polymer.

13. The film of claim 1, wherein the substrate comprises polyethylene terephthalate or polymethyl methacrylate.

14. The film of claim 1, wherein the substrate is a flexible substrate.

15. The film of claim 1, wherein the siloxane polymer comprises organic aryl groups, such as phenyl groups.

16. The film of claim 1, wherein the film comprises phosphors, selected from Yttrium-Aluminium-Garnet phosphors, silicate phosphors, and nitride phosphors.

17. A method for making a siloxane particle film, comprising:
   depositing on a substrate a siloxane composition that comprises a siloxane polymer formed without hydrosilylation, and having substantially no Si—OH groups therein, and having substantially no Si—H groups therein, and wherein the siloxane composition comprises a curing agent that aids in curing the siloxane polymer upon the application of ultraviolet light;
   wherein the siloxane composition has a weight average molecular weight of from 300 to 150,000 g/mol and a viscosity of from 1000 to 100,000 mPa-sec at 5 rpm viscometer and at 25° C.;
   directing ultraviolet light at the deposited siloxane composition so as to cure the composition and form a hardened film;
   wherein the hardened film is transmissive to visible light with an optical transmissivity of 95% or more in the visible spectrum, wherein the substrate comprises at least one light emitting diode, and the composition is deposited as an encapsulant thereon.

18. The method of claim 17, wherein the composition is deposited by ink jet or jet spray.

19. The method of claim 17, wherein the substrate is a substrate in a roll to roll process.

20. The method of claim 17, further comprising particles having an average particle size of less than 1 micron.

21. The method of claim 17, wherein the substrate is a wafer and the wafer is singulated after deposition and curing of the siloxane polymer.

22. The film of claim 1, having an index of refraction of from 1.4 to 1.45 at 632.8 nm wavelength.

23. The film of claim 1, having an index of refraction of from 1.58 to 1.95 at 632.8 nm wavelength.

24. The film of claim 1, having an index of refraction of from 1.65 to 1.85 at 632.8 nm wavelength.

25. The film of claim 1, having an index of refraction of less than 1.4 at 632.8 nm wavelength.

* * * * *